US012757482B2

(12) United States Patent
Kim et al.

(10) Patent No.: US 12,757,482 B2
(45) Date of Patent: Oct. 6, 2026

(54) INTEGRATED CIRCUIT DEVICE

(71) Applicant: Samsung Electronics Co., Ltd., Suwon-si (KR)

(72) Inventors: Jinbum Kim, Suwon-si (KR); Ingyu Jang, Suwon-si (KR); Sujin Jung, Suwon-si (KR); Gyeom Kim, Suwon-si (KR); Hyojin Kim, Suwon-si (KR); Yongjun Nam, Suwon-si (KR); Sangmoon Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 332 days.

(21) Appl. No.: 18/476,688

(22) Filed: Sep. 28, 2023

(65) Prior Publication Data

US 2024/0321885 A1 Sep. 26, 2024

(30) Foreign Application Priority Data

Mar. 22, 2023 (KR) ........................ 10-2023-0037539

(51) Int. Cl.
*H01L 27/092* (2006.01)
*H01L 21/8238* (2006.01)
(Continued)

(52) U.S. Cl.
CPC ........... *H10D 84/85* (2025.01); *H10D 84/017* (2025.01); *H10D 84/0186* (2025.01); *H10D 84/038* (2025.01)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/797; H10D 62/021; H10D 62/118; H10D 62/119; H10D 62/121; H10D 62/149; H10D 62/151; H10D 84/013; H10D 84/0149; H10D 84/0158; H10D 84/017; H10D 84/0186; H10D 84/0193; H10D 84/038;
(Continued)

(56) References Cited

U.S. PATENT DOCUMENTS

| | | | |
|---|---|---|---|
| 7,364,957 | B2 | 4/2008 | Thei et al. |
| 11,515,216 | B2 | 11/2022 | Chen et al. |

(Continued)

*Primary Examiner* — David C Spalla
(74) *Attorney, Agent, or Firm* — Wolf, Greenfield & Sacks, P.C.

(57) ABSTRACT

An integrated circuit device includes a first transistor comprising a first conductivity type, which includes a first channel region and a first source/drain region, a second transistor comprising a second conductivity type, which includes a second channel region and a second source/drain region, a first contact structure that contacts the first source/drain region and comprising a first length, and the first contact structure extends from above the first source/drain region and beyond an uppermost surface of the first channel region by a first vertical distance, and a second contact structure that contacts the second source/drain region and having a second length that is greater than the first length, the second contact extends from above the second source/drain region and beyond an uppermost surface of the second channel region by a second vertical distance, which is greater than the first vertical distance.

20 Claims, 29 Drawing Sheets

(51) Int. Cl.
*H10D 84/01* (2025.01)
*H10D 84/03* (2025.01)
*H10D 84/85* (2025.01)

(58) Field of Classification Search
CPC .... H10D 84/834; H10D 84/85; H10D 84/853; H01L 21/76895; H01L 21/76897; H01L 23/528; H01L 23/535
See application file for complete search history.

(56) References Cited

U.S. PATENT DOCUMENTS

| | | | | |
|---|---|---|---|---|
| 2016/0284697 | A1* | 9/2016 | Yoon | H10D 84/038 |
| 2022/0130961 | A1* | 4/2022 | Wu | H10D 84/038 |
| 2022/0181250 | A1* | 6/2022 | Yu | H10D 84/038 |
| 2022/0216340 | A1 | 7/2022 | Lin et al. | |
| 2022/0336614 | A1 | 10/2022 | Wang et al. | |
| 2022/0367622 | A1 | 11/2022 | Lin et al. | |
| 2023/0180451 | A1* | 6/2023 | Lin | H10D 84/0186 257/288 |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2023-0037539, filed on Mar. 22, 2023, in the Korean Intellectual Property Office, the disclosure of which is incorporated by reference herein in its entirety.

TECHNICAL FIELD

The present disclosure relates to an integrated circuit device, and more particularly, to an integrated circuit device including a field-effect transistor.

BACKGROUND

Due to the advance of electronics technology, integrated circuit devices have been rapidly down-scaled. Because semiconductor devices require the accuracy in operations as well as high operation speeds, various research for optimizing structures of transistors in semiconductor devices have been conducted.

SUMMARY

The present disclosure provides an integrated circuit device having a structure capable of achieving different electrical characteristics, which are desired according to channel types of transistors formed on the same substrate, even when the area of a device region is reduced along with the down-scaling of the integrated circuit device.

According to an aspect of the present disclosure, an integrated circuit device includes a first transistor of a first channel type, which includes a first fin-type active region on a first area of a substrate, a first channel region on the first fin-type active region, and a first source/drain region on the first fin-type active region and that contacts the first channel region, a second transistor of a second channel type, which includes a second fin-type active region on a second area of the substrate, a second channel region on the second fin-type active region, and a second source/drain region on the second fin-type active region and that contacts the second channel region. The integrated circuit device includes a first contact structure that contacts the first source/drain region and having a first length in a vertical direction, wherein the first contact structure extends from above the first source/drain region and beyond an uppermost surface of the first channel region by a first vertical distance, and a second contact structure that contacts the second source/drain region and having a second length, wherein the second contact structure extends from above the second source/drain region and beyond an uppermost surface of the second channel region by a second vertical distance, wherein the second vertical distance is greater than the first vertical distance, and wherein the second length of the second contact structure is greater than the first length of the first contact structure.

According to another aspect of the present disclosure, an integrated circuit device includes a first fin-type active region on a first area of a substrate, a first channel region on the first fin-type active region, a first source/drain region on the first fin-type active region and contacting the first channel region, a first gate line that at least partially surrounds the first channel region, a first insulating structure on the first source/drain region, and a first contact structure that extends through the first insulating structure and contacts the first source/drain region, wherein the first contact structure comprises a first length in a vertical direction. The integrated circuit device includes a second fin-type active region on a second area of the substrate, a second channel region on the second fin-type active region, a second source/drain region on the second fin-type active region and that contacts the second channel region, a second gate line that at least partially surrounds the second channel region, a second insulating structure on the second source/drain region, and a second contact structure that extends through the second insulating structure and contacts the second source/drain region, the second contact structure comprising a second length in the vertical direction, wherein the second length is greater than the first length of the first contact structure, wherein the first contact structure extends toward the substrate and beyond an uppermost surface of the first channel region by a first vertical distance, and the second contact structure extends toward the substrate and beyond an uppermost surface of the second channel region by a second vertical distance, wherein the second vertical distance is greater than the first vertical distance.

According to yet another aspect of the present disclosure, an integrated circuit device includes a first fin-type active region on a substrate, a first channel region on the first fin-type active region, a first gate line that at least partially surrounds the first channel region, a first source/drain region on the first fin-type active region and that contacts the first channel region, and a first contact structure that contacts the first source/drain region and comprises a first length in a vertical direction, wherein the first contact structure extends from above the first source/drain region and beyond an uppermost surface of the first channel region by a first vertical distance. The integrated circuit device includes a second fin-type active region on the substrate, a second channel region on the second fin-type active region and including a plurality of nanosheets spaced apart from each other in the vertical direction, a second gate line that at least partially surrounds the plurality of nanosheets, a second source/drain region on the second fin-type active region and that contacts the plurality of nanosheets, the second source/drain region including a plurality of protrusions that are convex toward the second gate line, and a second contact structure in the vertical direction, the second contact structure extends from above the second source/drain region and beyond an uppermost surface of the second channel region by a second vertical distance, wherein the second vertical distance is greater than the first vertical distance, wherein the second contact structure comprises a nonlinear-shaped portion that faces the second channel region and includes a plurality of local protrusions that extend outwardly in a horizontal direction.

BRIEF DESCRIPTION OF THE DRAWINGS

Embodiments will be more clearly understood from the following detailed description taken in conjunction with the accompanying drawings in which.

DETAILED DESCRIPTION

Figure 1:
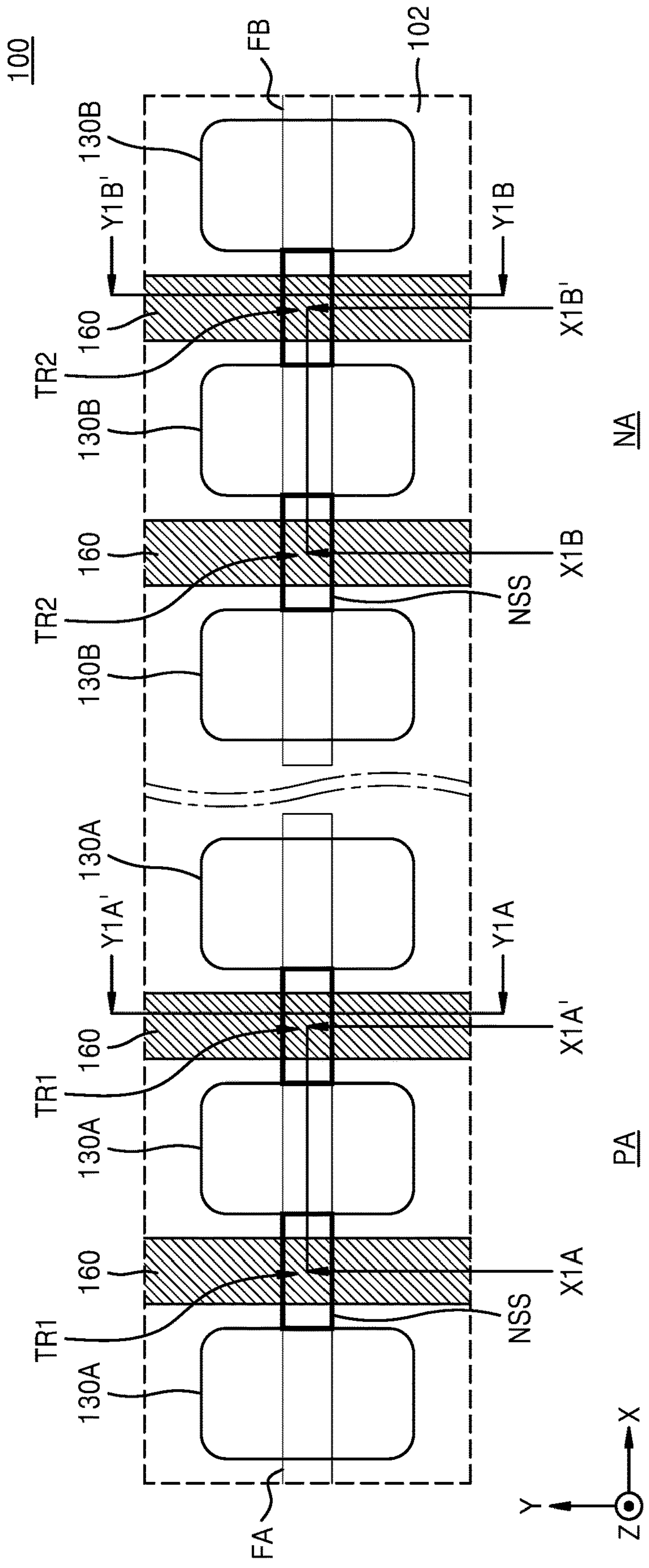
FIG. 1 is a planar layout diagram of some components of an integrated circuit device according to some embodiments of the present disclosure.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements. As used herein, the phrase "at least one of A, B, and C" refers to a logical (A OR B OR C) using a non-exclusive logical OR, and should not be construed to mean "at least one of A, at least one of B and at least one of C." As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items. As used herein, "an element A is at a same level as element B" refers to at least one surface of element A that is coplanar with at least one surface of element B. The term "connected" may be used herein to refer to a physical and/or electrical connection and may refer to a direct or indirect physical and/or electrical connection.

Hereinafter, embodiments of the present disclosure will be described in detail with reference to the accompanying drawings. Like components are denoted by like reference numerals throughout the specification, and repeated descriptions thereof are omitted.

Figure 2A:
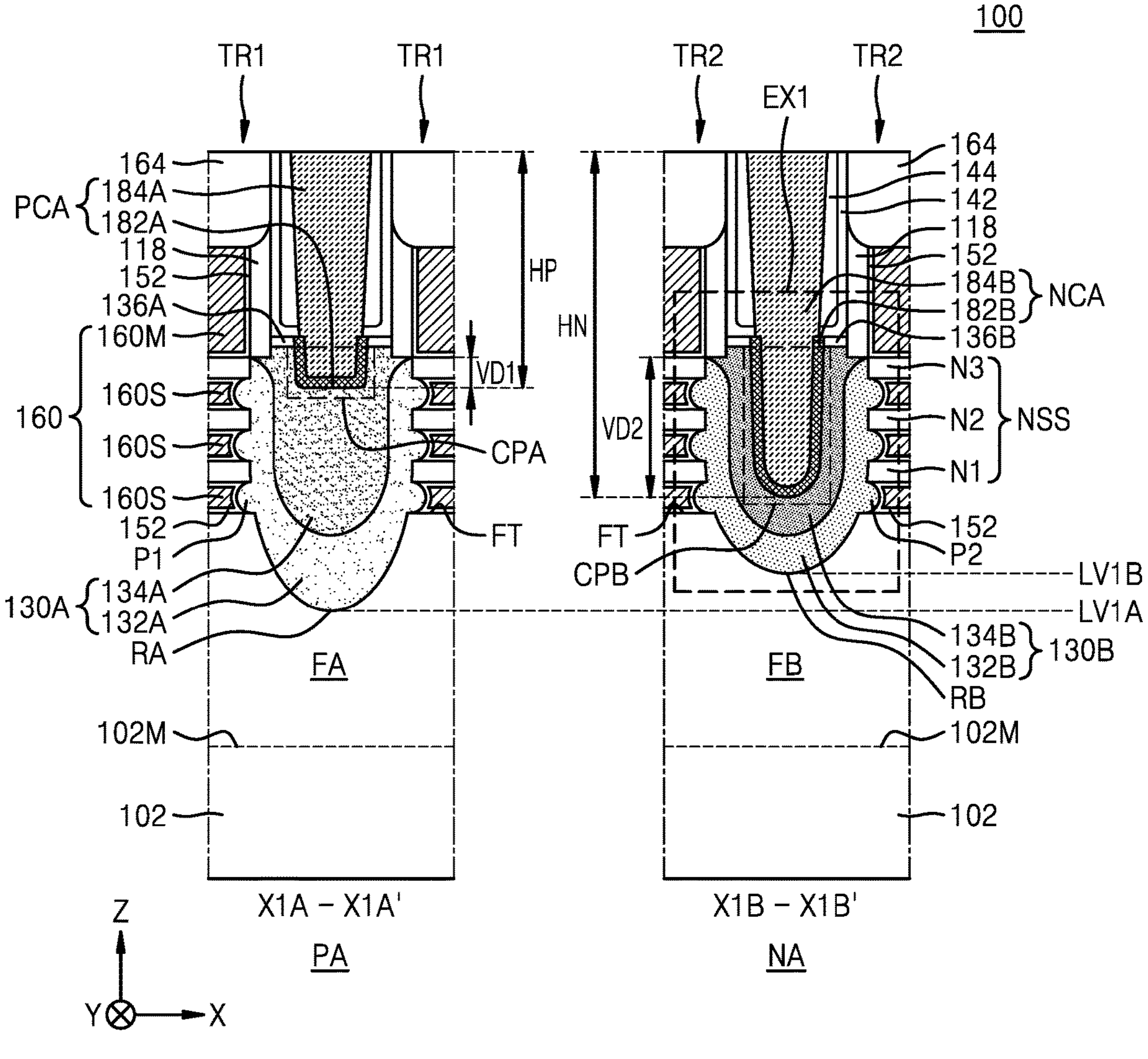
FIG. 2A illustrates cross-sectional views of some components, respectively taken along the lines X1A-X1A' and X1B-X1B' of FIG. 1.
Figure 2B:
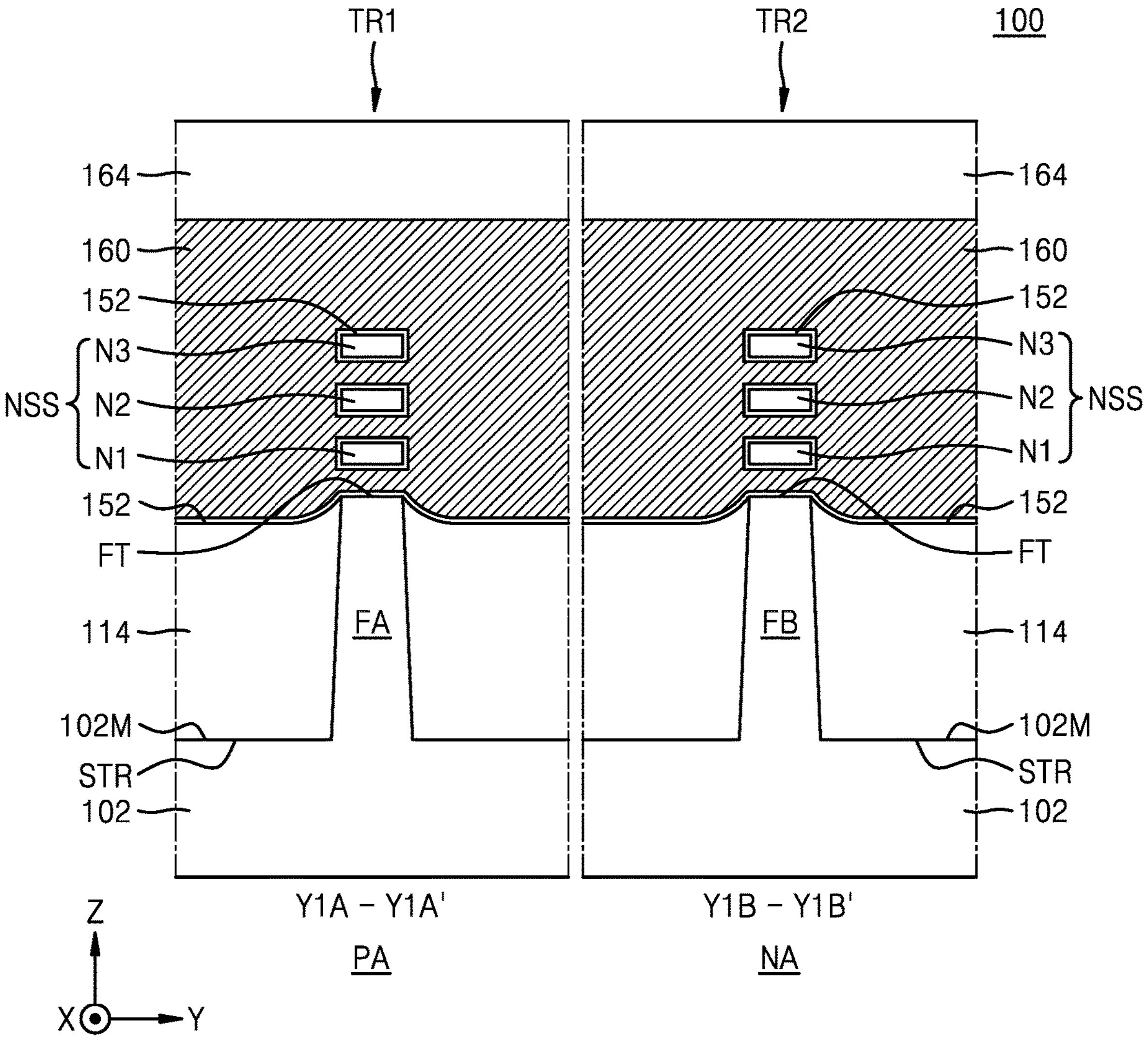
FIG. 2B illustrates cross-sectional views of some components, respectively taken along the lines Y1A-Y1A' and Y1B-Y1B' of FIG. 1.
Figure 2C:
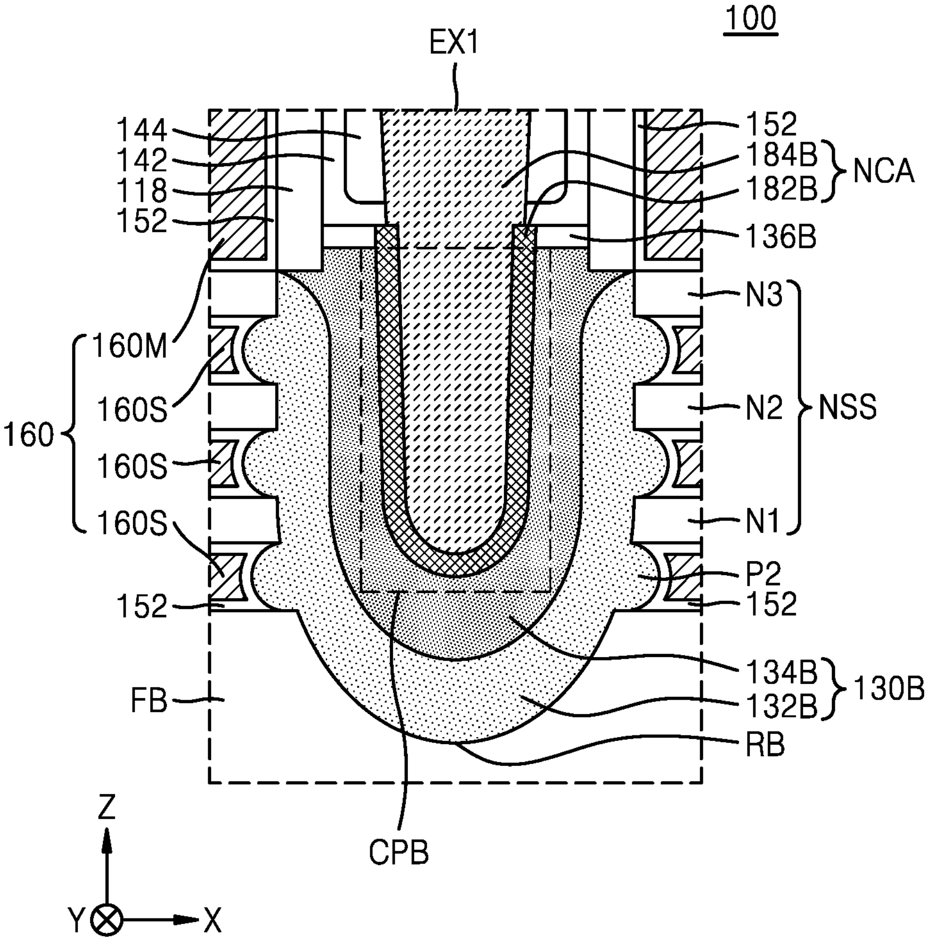
FIG. 2C is an enlarged cross-sectional view of some components, which are included in the region EX1 of FIG. 2A.

FIG. 1 is a planar layout diagram of some components of an integrated circuit device 100 according to some embodiments. FIG. 2A illustrates cross-sectional views of some components, respectively taken along the lines X1A-X1A' and X1B-X1B' of FIG. 1. FIG. 2B illustrates cross-sectional views of some components, respectively taken along the lines Y1A-Y1A' and Y1B-Y1B' of FIG. 1. FIG. 2C is an enlarged cross-sectional view of some components, which are included in the region EX1 of FIG. 2A. The integrated circuit device 100 including a field-effect transistor, which has a gate-all-around structure including a nanowire or nanosheet-shaped active region and a gate surrounding the active region, is described with reference to FIGS. 1 and 2A to 2C.

Referring to FIGS. 1 and 2A to 2C, the integrated circuit device 100 may include a substrate 102 having a first area PA and a second area NA. The first area PA may include an N-channel metal-oxide semiconductor (NMOS) transistor area and the second area NA may include a p-channel metal-oxide semiconductor (PMOS) transistor area.

The substrate 102 may include a semiconductor, such as Si or Ge, or a compound semiconductor, such as SiGe, SiC, GaAs, InAs, InGaAs, or InP. As used herein, each of the terms "SiGe", "SiC", "GaAs", "InAs", "InGaAs", and "InP" refers to a material including elements contained in each term and is not a chemical formula representing a stoichiometric relationship. The substrate 102 may include a conductive region, for example, an impurity-doped well or an impurity-doped structure.

A first fin-type active region FA may be on the first area PA of the substrate 102 and a second fin-type active region FB may be on the second area NA of the substrate 102. The first fin-type active region FA and the second fin-type active region FB may extend in the vertical direction (Z direction) from the substrate 102 and extend in the first horizontal direction (X direction). The first fin-type active region FA and the second fin-type active region FB may be defined by a device isolation trench STR that is formed in the substrate 102. In the first area PA and the second area NA, the device isolation trench STR may be filled with a device isolation film 114. The device isolation film 114 may include a silicon oxide film, a silicon nitride film, or a combination thereof.

A gate line 160 may extend lengthwise in the second horizontal direction (Y direction), which intersects with the first horizontal direction (X direction), over the first fin-type active region FA and the second fin-type active region FB. The device isolation film 114 may be between the substrate 102 and the gate line 160 and may be on and/or cover a sidewall of each of the first fin-type active region FA and the second fin-type active region FB.

In intersection areas between each of the first fin-type active region FA and the second fin-type active region FB and the gate line 160, a plurality of nanosheet stacks NSS may be above a fin top surface FT of each of the first fin-type active region FA and the second fin-type active region FB. The plurality of nanosheet stacks NSS may be arranged apart from each of the first fin-type active region FA and the second fin-type active region FB in the vertical direction (Z direction) to face the fin top surface FT thereof.

Each of the plurality of nanosheet stacks NSS may include a plurality of nanosheets (that is, N1, N2, and N3) above the fin top surface FT of each of the first and second fin-type active regions FA and FB to overlap each other in the vertical direction (Z direction). As used herein, the term "nanosheet" refers to a conductive structure having a cross-section that is substantially perpendicular to a current-flowing direction. The nanosheet may also be understood as including a nanowire. The plurality of nanosheets (that is, N1, N2, and N3) may be apart from each other in the vertical direction (Z direction) and may respectively have different vertical distances (Z-direction distances) from the fin top surface FT of each fin-type active region (that is, FA or FB). The plurality of nanosheets (that is, N1, N2, and N3) may respectively include a first nanosheet N1, a second nanosheet N2, and a third nanosheet N3, which are stacked in the stated order over the fin top surface FT of each fin-type active region (that is, FA or FB).

The respective numbers of nanosheet stacks NSS and gate lines 160 above are not limited to the examples described herein. For example, one nanosheet stack NSS or a plurality of nanosheet stacks NSS and one gate line 160 or a plurality of gate lines 160 may be on one fin-type active region (that is, FA or FB).

FIGS. 2A to 2C illustrate an example in which each of the plurality of nanosheet stacks NSS includes three nanosheets, that is, the first to third nanosheets N1, N2, and N3, but the present disclosure is not limited thereto. The number of nanosheets constituting a nanosheet stack NSS is not particularly limited. For example, each of the plurality of nanosheet stacks NSS may include one nanosheet, two nanosheets, or four or more nanosheets. Each of the plurality of nanosheets (that is, N1, N2, and N3) may have a channel region. For example, each of the plurality of nanosheets (that is, N1, N2, and N3) may have, but is not limited to, a thickness selected from a range of about 4 nm to about 6 nm. Here, the thickness of each of the plurality of nanosheets (that is, N1, N2, and N3) refers to a size in the vertical direction (Z direction). In some embodiments, the plurality of nanosheets (that is, N1, N2, and N3) may have substantially the same thickness in the vertical direction (Z direction). In some embodiments, at least some of the plurality of nanosheets (that is, N1, N2, and N3) may have different thicknesses from each other in the vertical direction (Z direction).

In some embodiments, the plurality of nanosheets (that is, N1, N2, and N3), which are included in one nanosheet stack NSS, may have the same size in the first horizontal direction (X direction). In some embodiments, at least some of the plurality of nanosheets (that is, N1, N2, and N3), which are included in one nanosheet stack NSS, may have different sizes from each other in the first horizontal direction (X direction). For example, in the first horizontal direction (X direction), the length of the first nanosheet N1, which is closest to the fin top surface FT of each fin-type active region (that is, FA or FB), from among the plurality of nanosheets (that is, N1, N2, and N3) may be greater than the length of at least one of the second nanosheet N2 and the third nanosheet N3.

Herein, the plurality of nanosheets (that is, N1, N2, and N3) or the nanosheet stack NSS above the first fin-type active region FA of the first area PA may be referred to as a "first channel region," and the plurality of nanosheets (that is, N1, N2, and N3) or the nanosheet stack NSS above the second fin-type active region FB of the second area NA may be referred to as a "second channel region."

The plurality of nanosheets (that is, N1, N2, and N3) may respectively include semiconductor layers including the same element. In some embodiments, each of the plurality of nanosheets may include an undoped Si layer. In some embodiments, each of the plurality of nanosheets may include a doped Si layer. For example, each of the plurality of nanosheets of the first area PA may include an Si layer doped with a p-type dopant and each of the plurality of nanosheets of the second area NA may include an Si layer doped with an n-type dopant. The p-type dopant may be selected from boron (B) and gallium (Ga). The n-type dopant may be selected from phosphorus (P), arsenic (As), and antimony (Sb).

As shown in FIG. 2A, a first recess RA may be formed in an upper surface of the first fin-type active region FA and a second recess RB may be formed in an upper surface of the second fin-type active region FB. FIG. 2A illustrates an example in which a vertical level of the lowermost surface of each of the first recess RA and the second recess RB is lower than a vertical level of the fin top surface FT of each of the first fin-type active region FA and the second fin-type active region FB, but the present disclosure is not limited thereto. The vertical level of the lowermost surface of each of the first recess RA and the second recess RB may be equal to or similar to the vertical level of the fin top surface FT of a fin-type active region (that is, FA or FB). As used herein, the term "vertical level" refers to a height in the vertical direction (+Z direction or −Z direction) from a main surface 102M of the substrate 102.

In the first area PA, a first source/drain region 130A may be on the first recess RA. The first source/drain region 130A may be on the first fin-type active region FA and contact the plurality of nanosheets (that is, N1, N2, and N3) that are adjacent to the first source/drain region 130A. In the second area NA, a second source/drain region 130B may be on the second recess RB. The second source/drain region 130B may be arranged on the second fin-type active region FB and contact the plurality of nanosheets that are adjacent to the second source/drain region 130B.

In each of the first area PA and the second area NA, the gate line 160 may be above the first fin-type active region FA or the second fin-type active region FB to cover the plurality of nanosheet stacks NSS and surround each of the plurality of nanosheets (that is, N1, N2, and N3). A plurality of transistors may be formed on the substrate 102 in the intersection areas between each of the first fin-type active region FA and the second fin-type active region FB and the gate line 160. A first channel-type transistor TR1 may be formed in each intersection area between the first fin-type active region FA and the gate line 160 of the first area PA, and a second channel-type transistor TR2 may be formed in each intersection area between the second fin-type active region FB and the gate line 160 in the second area NA. The first channel-type transistor TR1 may include a PMOS transistor and the second channel-type transistor TR2 may include an NMOS transistor.

In each of the first area PA and the second area NA, the gate line 160 may include a main gate portion 160M and a plurality of sub-gate portions 160S. The main gate portion 160M may extend lengthwise in the second horizontal direction (Y direction) and on/to cover an upper surface of the nanosheet stack NSS. The plurality of sub-gate portions 160S may be integrally connected to the main gate portion 160M and may be respectively arranged one-by-one between the plurality of nanosheets (that is, N1, N2, and N3) and between the first nanosheet N1 and the fin top surface FT of each fin-type active region (that is, FA or FB). As used herein, "an element A that is integrally connected to element B" refers to elements A and B being monolithic or provided as a unitary object.

The gate line 160 may include a metal, a metal nitride, a metal carbide, or a combination thereof. The metal may be selected from Ti, W, Ru, Nb, Mo, Hf, Ni, Co, Pt, Yb, Tb, Dy, Er, and Pd. The metal nitride may be selected from TiN and TaN. The metal carbide may include TiAlC. In some embodiments, the gate line 160 may have a structure in which a metal nitride film, a metal film, a conductive capping film, and a gap-fill metal film are stacked in the stated order. Each of the metal nitride film and the metal film may include at least one metal selected from Ti, Ta, W, Ru, Nb, Mo, and Hf. The gap-fill metal film may include a W film or an Al film. Each of the plurality of gate lines 160 may include at least one work function metal-containing film. The at least one work function metal-containing film may include at least one metal selected from Ti, W, Ru, Nb, Mo, Hf, Ni, Co, Pt, Yb, Tb, Dy, Er, and Pd. In some embodiments, the gate line 160 may include, but is not limited to, a stack structure of TiAlC/TiN/W, a stack structure of TiN/TaN/TiAlC/TiN/W, or a stack structure of TiN/TaN/TiN/TiAlC/TiN/W. In some embodiments, the gate line 160 of the first area PA and the gate line 160 of the second area NA may have different thicknesses, different materials, or different stack structures. Herein, the gate line 160 of the first area PA may be referred to as a "first gate line" and the gate line 160 of the second area NA may be referred to as a "second gate line."

In each of the first area PA and the second area NA, a gate dielectric film 152 may be between the plurality of nanosheets (that is, N1, N2, and N3) and the gate line 160. The gate dielectric film 152 may include portions on and/or covering respective surfaces of the plurality of nanosheets, portions on and/or covering sidewalls of the main gate portion 160M, portions on and/or covering respective fin top surfaces FT of the first fin-type active region FA and the second fin-type active region FB, and portions on and/or covering an upper surface of the device isolation film 114.

In some embodiments, the gate dielectric film 152 may include a high-K film. The high-K film may include a material having a dielectric constant that is greater than that of a silicon oxide film. For example, the high-K film may have a dielectric constant of about 10 to about 25. The high-K film may include, but is not limited to, hafnium oxide. In some embodiments, the gate dielectric film 152 of the first area PA and the gate dielectric film 152 of the second area NA may have different thicknesses, different materials, or different stack structures.

As shown in FIGS. 2A and 2B, a capping insulation pattern 164 may be on and/or cover the gate line 160 and the gate dielectric film 152. The capping insulating pattern 164 may include a silicon nitride film.

In each of the first area PA and the second area NA, An outer insulating spacer 118 may be on and/or cover both sidewalls of the gate line 160. The outer insulating spacer 118 may be on the upper surface of the nanosheet stack NSS to cover both sidewalls of the main gate portion 160M. The outer insulating spacer 118 may be apart from the gate line 160 with the gate dielectric film 152 therebetween. The outer insulating spacer 118 may include silicon nitride, silicon oxide, SiCN, SiBN, SiON, SiOCN, SiBCN, SiOC, or a combination thereof. As used herein, each of the terms "SiCN", "SiBN", "SiON", "SiOCN", "SiBCN", and "SiOC" refers to a material including elements contained in each term and is not a chemical formula representing a stoichiometric relationship.

In the first area PA, the first source/drain region 130A may face a sub-gate portion 160S of the gate line 160 adjacent thereto in the first horizontal direction (X direction). The first source/drain region 130A may include a first lower body layer 132A and a first upper body layer 134A, which are stacked in the stated order in the vertical direction (Z direction) on a surface of the first recess RA that is formed in the first fin-type active region FA. Each of the first lower body layer 132A and the first upper body layer 134A may include an $Si_{1-x}Ge_x$ layer (where $0.0<x\leq0.6$) doped with a p-type dopant, and the Ge content of the first upper body layer 134A may be greater than the Ge content of the first lower body layer 132A. In some embodiments, the Ge content of the first lower body layer 132A may be greater than about 0.0 at % and less than or equal to about 20 at %, for example, greater than or equal to about 15 at % and less than or equal to about 30 at %. The Ge content of the first upper body layer 134A may be greater than or equal to about 30 at % and less than or equal to about 60 at %, for example, greater than or equal to about 40 at % and less than or equal to about 60 at %. However, the present disclosure is not limited to the examples set forth above. In some embodiments, the p-type dopant may include, but is not limited to, at least one selected from boron (B) and gallium (Ga).

The first source/drain region 130A may include a plurality of protrusions P1 extending outward toward the sub-gate portions 160S of the gate line 160 adjacent thereto. The plurality of protrusions P1 may be portions of the first lower body layer 132A. The number of protrusions P1, which are included in the first source/drain region 130A, may correspond to the number of sub-gate portions 160S facing the first source/drain region 130A in the first horizontal direction (X direction). FIG. 2A illustrates an example of a configuration in which one first source/drain region 130A includes six protrusions P1.

In the first area PA, a first semiconductor capping layer 136A may be on and/or cover an upper surface of the first source/drain region 130A. In some embodiments, the first semiconductor capping layer 136A may include an undoped Si layer, an Si layer doped with a p-type dopant, or an SiGe layer having Ge content that is less than the Ge content of the first upper body layer 134A.

In the second area NA, the second source/drain region 130B may face a sub-gate portion 160S of the gate line 160 adjacent thereto in the first horizontal direction (X direction). The second source/drain region 130B may include a second lower body layer 132B and a second upper body layer 134B, which are stacked in the stated order in the vertical direction (Z direction) on a surface of the second recess RB that is formed in the second fin-type active region FB. In some embodiments, the second lower body layer 132B may include an undoped Si layer and the second upper body layer 134B may include an Si layer doped with an n-type dopant. In some embodiments, the second lower body layer 132B and the second upper body layer 134B may respectively include Si layers doped with an n-type dopant, and here, the amount of the n-type dopant of the second upper body layer 134B may be greater than the amount of the n-type dopant of the second lower body layer 132B. The n-type dopant may include, but is not limited to, at least one selected from phosphorus (P), arsenic (As), and antimony (Sb).

The second source/drain region 130B may include a plurality of protrusions P2 extending outward toward the sub-gate portions 160S of the gate line 160 adjacent thereto. The plurality of protrusions P2 may be portions of the second lower body layer 132B. The number of protrusions P2, which are included in the second source/drain region 130B, may correspond to the number of sub-gate portions 160S facing the second source/drain region 130B in the first horizontal direction (X direction). FIGS. 2A and 2C illustrate an example of a configuration in which one second source/drain region 130B includes six protrusions P2.

In the second area NA, a second semiconductor capping layer 136B may be on and/or cover an upper surface of the second source/drain region 130B. In some embodiments, the second semiconductor capping layer 136B may include an undoped Si layer or an Si layer doped with an n-type dopant. When the second semiconductor capping layer 136B includes an Si layer doped with an n-type dopant, the amount of the n-type dopant of the second semiconductor capping layer 136B may be less than the amount of the n-type dopant of the second lower body layer 132B. The second semiconductor capping layer 136B may be in contact with an upper surface of the second upper body layer 134B of the second source/drain region 130B. The density of the second semiconductor capping layer 136B may be less than the density of the second source/drain region 130B. In some embodiments, the second semiconductor capping layer 136B may include a porous structure having a plurality of pores and each of the plurality of pores may have a size that enables an Si atom and/or a Ge atom to pass through.

As shown in FIG. 2A, the first source/drain region 130A of the first area PA and the second source/drain region 130B of the second area NA may have different shapes and sizes. In some embodiments, a vertical level LV1A of the lowermost surface of the first source/drain region 130A may be closer to the substrate 102 than a vertical level LV1B of the lowermost surface of the second source/drain region 130B. In the vertical direction (Z direction), the length of the first source/drain region 130A may be greater than the length of the second source/drain region 130B. The shapes and sizes of the first source/drain region 130A and the second source/drain region 130B are not limited to the example shown in FIG. 2A and may be variously modified.

An insulating structure may be on and/or cover each of the first and second source/drain regions 130A and 130B. The insulating structure may include an insulating liner 142 and an inter-gate dielectric 144, which are on and/or cover the first and second source/drain regions 130A and 130B in the stated order. In the first area PA, the insulating liner 142 may be apart from the first source/drain region 130A with the first semiconductor capping layer 136A therebetween. In the second area NA, the insulating liner 142 may be apart from the second source/drain region 130B with the second semiconductor capping layer 136B therebetween.

In the first area PA, the inter-gate dielectric 144 may be apart from the first source/drain region 130A with the insulating liner 142 and the first semiconductor capping layer 136A therebetween. In the second area NA, the inter-gate dielectric 144 may be apart from the second source/drain region 130B with the insulating liner 142 and the second semiconductor capping layer 136B therebetween. In the first area PA and the second area NA, the inter-gate dielectric 144 may be on and/or cover a sidewall of the gate line 160. Herein, among the insulating structures, the insulating structure on and/or covering the first source/drain region 130A in the first area PA may be referred to as a "first insulating structure," and the insulating structure on and/or covering the second source/drain region 130B in the second area NA may be referred to as a "second insulating structure."

In the first area PA and the second area NA, the density of the insulating liner 142 may be less than the density of the inter-gate dielectric 144. In some embodiments, the insulating liner 142 may include a porous structure having a plurality of pores and each of the plurality of pores may have a size that enables an Si atom and/or a Ge atom to pass through. In some embodiments, the insulating liner 142 may include SiN, SiCN, SiBN, SiON, SiOCN, SiBCN, SiOC, $SiO_2$, or a combination thereof. In some embodiments, the inter-gate dielectric 144 may include a silicon nitride film, a silicon oxide film, SiON, SiOCN, or a combination thereof.

As shown in FIG. 2A, in the first area PA, a first contact structure PCA may extend through the first insulating structure, which includes the insulating liner 142 and the inter-gate dielectric 144, and the first semiconductor capping layer 136A in the vertical direction (Z direction) to contact the first source/drain region 130A. In the first area PA, the first semiconductor capping layer 136A, the insulating liner 142, and the inter-gate dielectric 144 may surround a sidewall of the first contact structure PCA.

In the second area NA, a second contact structure NCA may extend through the second insulating structure, which includes the insulating liner 142 and the inter-gate dielectric 144, and the second semiconductor capping layer 136B in the vertical direction (Z direction) to contact the second source/drain region 130B. In the second area NA, the second semiconductor capping layer 136B, the insulating liner 142, and the inter-gate dielectric 144 may surround a sidewall of the second contact structure NCA.

In the vertical direction (Z direction), the first contact structure PCA may have a first length HP and the second contact structure NCA may have a second length HN that is greater than the first length HP of the first contact structure PCA. In some embodiments, the difference between the second length HN of the second contact structure NCA and the first length HP of the first contact structure PCA may be at least 10 nm. For example, the second length HN of the second contact structure NCA may be greater than the first length HP of the first contact structure PCA by as much as about 10 nm to about 30 nm or about 15 nm to about 35 nm.

The first contact structure PCA may extend toward the substrate 102 by a first vertical distance VD1 from a vertical level of the uppermost surface of the nanosheet stack NSS of the first area PA, and the second contact structure NCA may extend toward the substrate 102 by a second vertical distance VD2 from a vertical level of the uppermost surface of the nanosheet stack NSS of the second area NA. In some embodiments, the second vertical distance VD2 is greater than the first vertical distance VD1. In some embodiments, in the vertical direction (Z direction), the second vertical distance VD2 may be greater than the first vertical distance VD1 by at least 10 nm. For example, the second vertical distance VD2 may be greater than the first vertical distance VD1 by about 10 nm to about 30 nm or about 15 nm to about 35 nm.

The first contact structure PCA may have a first contact portion CPA that contacts the first source/drain region 130A. The second contact structure NCA may have a second contact portion CPB that contacts the second source/drain region 130B. In the vertical direction (Z direction), the length of the second contact portion CPB may be greater than the length of the first contact portion CPA by at least 10 nm. For example, in the vertical direction (Z direction), the length of the second contact portion CPB may be greater than the length of the first contact portion CPA by about 10 nm to about 30 nm or about 15 nm to about 35 nm.

The first contact structure PCA may include a first metal silicide film 182A, which contacts the first source/drain region 130A, and a first conductive plug 184A, which is apart from the first source/drain region 130A with the first metal silicide film 182A therebetween. The second contact structure NCA may include a second metal silicide film 182B, which contacts the second source/drain region 130B, and a second conductive plug 184B, which is apart from the second source/drain region 130B with the second metal silicide film 182B therebetween. In the vertical direction (Z direction), the length of the second metal silicide film 182B may be greater than the length of the first metal silicide film 182A and the length of the second conductive plug 184B may be greater than the length of the first conductive plug 184A.

Each of the first and second metal silicide films 182A and 182B may include Ti, W, Ru, Nb, Mo, Hf, Ni, Co, Pt, Yb, Tb, Dy, Er, or Pd. For example, each of the first and second metal silicide films 182A and 182B may include titanium silicide.

The first and second conductive plugs 184A and 184B may contact the first and second metal silicide films 182A and 182B, respectively. The first and second conductive plugs 184A and 184B may be connected to the first and second source/drain regions 130A and 130B via the first and second metal silicide films 182A and 182B, respectively. In some embodiments, each of the first and second conductive plugs 184A and 184B may include a conductive barrier film and a metal plug surrounded by the conductive barrier film. The conductive barrier film may include, but is not limited to, Ti, Ta, TiN, TaN, or a combination thereof and the metal plug may include, but is not limited to, W, Co, Mo, Cu, Ru, Mn, or a combination thereof. In some embodiments, at least one of the first and second conductive plugs 184A and 184B may not include a conductive barrier film.

The first contact structure PCA may face some nanosheets selected from the plurality of nanosheets (that is, N1, N2, and N3) of the nanosheet stack NSS of the first area PA in the first horizontal direction (X direction). The second contact structure NCA may face some nanosheets selected from the plurality of nanosheets (that is, N1, N2, and N3) of the nanosheet stack NSS of the second area NA in the first horizontal direction (X direction). The number of nanosheets facing the first contact structure PCA in the first horizontal direction (X direction) in the first area PA may be less than the number of nanosheets facing the second contact structure NCA in the first horizontal direction (X direction) in the second area NA. For example, the first contact structure PCA may face m nanosheets (where m is a natural number of 1 or more) in the first horizontal direction (X direction) and the second contact structure NCA may face n nanosheets (where n is a natural number that is greater than m) in the first horizontal direction (X direction). In the first area PA, the first contact structure PCA may not face at least one nanosheet selected from the plurality of nanosheets, in the first horizontal direction (X direction). In the second area NA, the second contact structure NCA may face at least two nanosheets from among the plurality of nanosheets. FIG. 2A illustrates an example of a configuration in which the first contact structure PCA faces the third nanosheet N3 corresponding to one nanosheet in the first horizontal direction (X direction) and the second contact structure NCA faces the first to third nanosheets N1, N2, and N3 corresponding to three nanosheets in the first horizontal direction (X direction), but the present disclosure is not limited to the example shown in FIG. 2A.

The integrated circuit device 100 shown in FIGS. 1 and 2A to 2C may include the first contact structure PCA, which is connected to the first source/drain region 130A, and the second contact structure NCA, which is connected to the second source/drain region 130B, and here, the second length HN of the second contact structure NCA may be greater in the vertical direction (Z direction) than the first length HP of the first contact structure PCA. In addition, the first contact structure PCA may have the first contact portion CPA contacting the first source/drain region 130A, the second contact structure NCA may have the second contact portion CPB contacting the second source/drain region 130B, and the length of the second contact portion CPB may be greater in the vertical direction (Z direction) than the length of the first contact portion CPA. Therefore, when the second channel-type transistor TR2 includes an NMOS transistor, the contact area between the second source/drain region 130B and the second contact structure NCA may be increased, thereby reducing the contact resistance therebetween. Therefore, even when the area of a device region is reduced along with the down-scaling of the integrated circuit device 100, different electrical characteristics respectively desired by the channel types of the first channel-type transistor TR1 and the second channel-type transistor TR2 may be achieved and the reliability of the integrated circuit device 100 may thereby improve.

Figure 3:
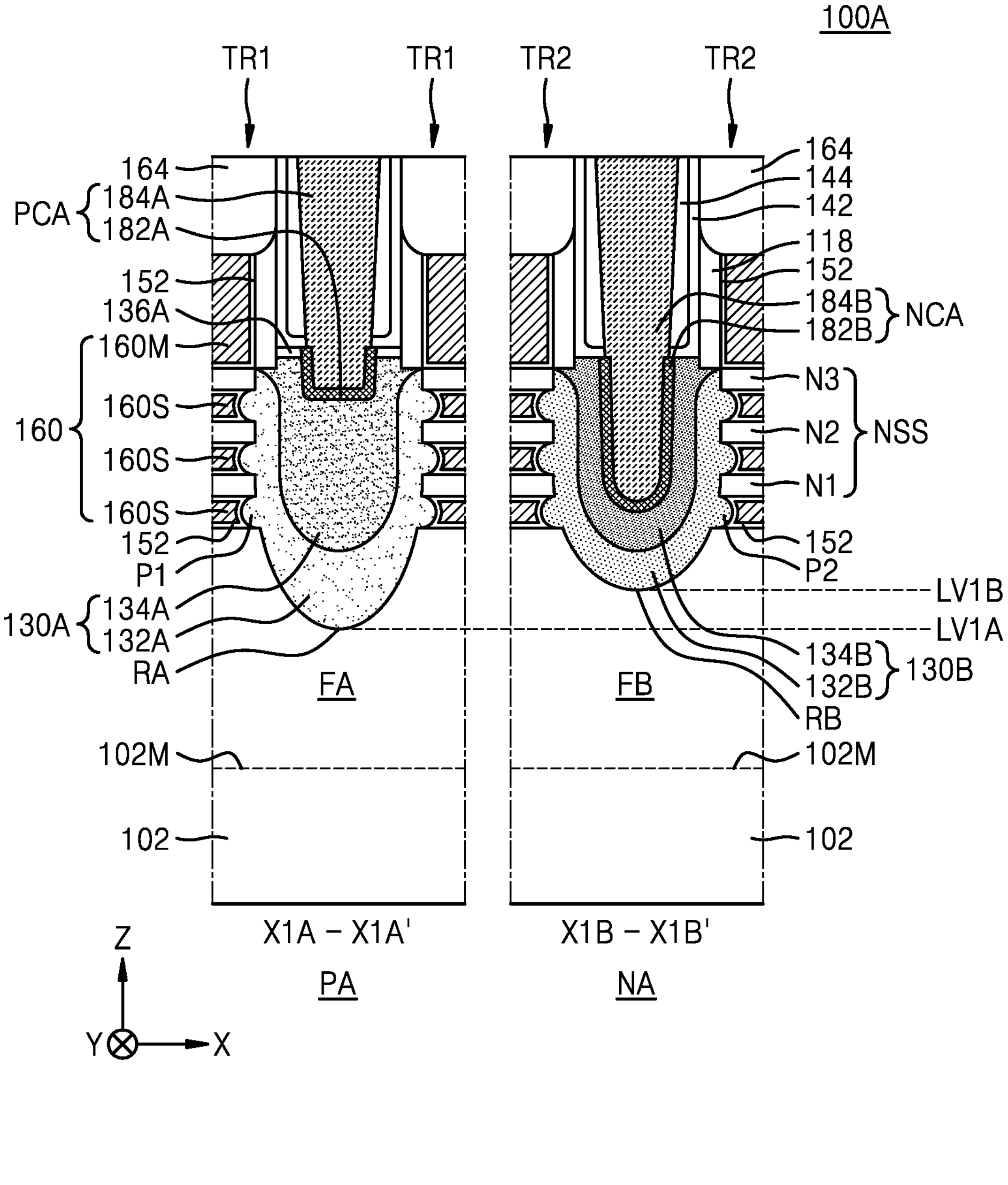
FIG. 3 is a cross-sectional view illustrating an integrated circuit device according to some embodiments of the present disclosure.

FIG. 3 is a cross-sectional view illustrating an integrated circuit device 100A according to some embodiments. FIG. 3 illustrates some components in portions of the integrated circuit device 100A, which respectively correspond to the cross-sections taken along the lines XIA-XIA' and X1B-X1B' of FIG. 1. In FIG. 3, the same reference numerals as in FIGS. 1 and 2A to 2C respectively denote the same members, and here, repeated descriptions thereof are omitted.

Referring to FIG. 3, the integrated circuit device 100A may have substantially the same configuration as the integrated circuit device 100 described with reference to FIGS. 1 and 2A to 2C. However, in the second area NA of the integrated circuit device 100A, the second semiconductor capping layer 136B between the second source/drain region 130B and the insulating liner 142 is omitted. Therefore, in the second area NA of the integrated circuit device 100A, the insulating liner 142 may be in contact with an upper surface of the second upper body layer 134B of the second source/drain region 130B.

Figure 4:
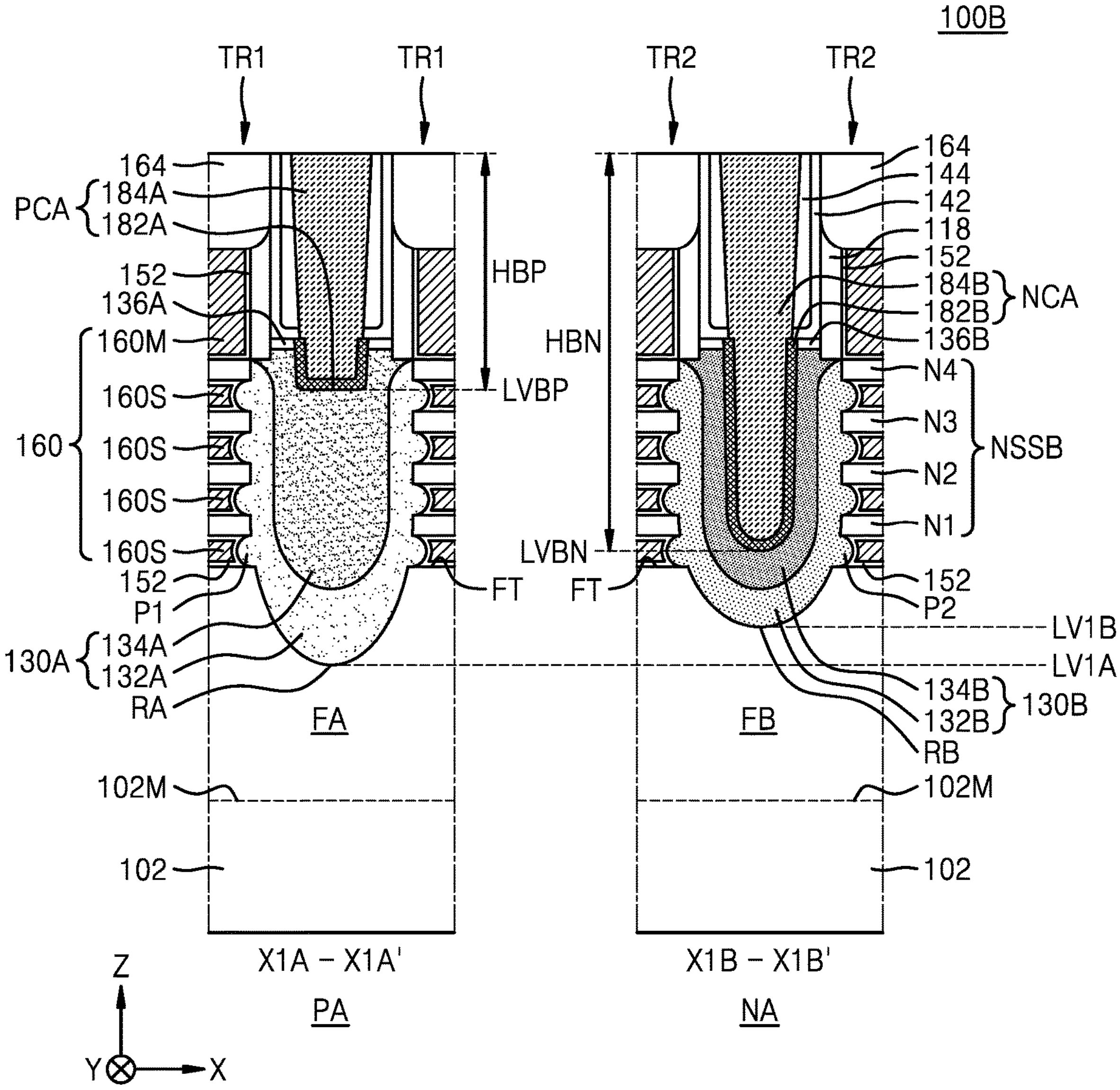
FIG. 4 is a cross-sectional view illustrating an integrated circuit device according to some embodiments of the present disclosure.

FIG. 4 is a cross-sectional view illustrating an integrated circuit device 100B according to some embodiments. FIG. 4 illustrates some components in portions of the integrated circuit device 100B, which respectively correspond to the cross-sections taken along the lines XIA-XIA' and X1B-X1B' of FIG. 1. In FIG. 4, the same reference numerals as in FIGS. 1 and 2A to 2C respectively denote the same members, and here, repeated descriptions thereof are omitted.

Referring to FIG. 4, the integrated circuit device 100B may have substantially the same configuration as the integrated circuit device 100 described with reference to FIGS. 1 and 2A to 2C. However, in the integrated circuit device 100B, in the intersection areas between each of the first fin-type active region FA and the second fin-type active region FB and the gate line 160, a plurality of nanosheet stacks NSSB may be above the fin top surface FT of each of the first fin-type active region FA and the second fin-type active region FB.

The plurality of nanosheet stacks NSSB may have substantially the same configuration as the plurality of nanosheet stacks NSS described with reference to FIGS. 2A and 2C. However, the plurality of nanosheet stacks NSSB include first to fourth nanosheets N1, N2, N3, and N4 overlapping each other in the vertical direction (Z direction) over the fin top surface FT of each fin-type active region (that is, FA or FB).

In the integrated circuit device 100B, the first source/drain region 130A may include a plurality of protrusions P1 extending outward toward the sub-gate portion 160S of the gate line 160 adjacent thereto. The plurality of protrusions P1 may be portions of the first lower body layer 132A. The second source/drain region 130B may include a plurality of protrusions P2 extending outward toward the sub-gate portion 160S of the gate line 160 adjacent thereto. The plurality of protrusions P2 may be portions of the second lower body layer 132B.

The number of protrusions P1 in the first source/drain region 130A and the number of protrusions P2 in the second source/drain region 130B may respectively correspond to the numbers of sub-gate portions 160S, which respectively face the first source/drain region 130A and the second source/drain region 130B in the first horizontal direction (X direction). FIG. 4 illustrates an example of a configuration in which the first source/drain region 130A includes eight protrusions P1 and the second source/drain region 130B includes eight protrusions P2.

Figure 5A:
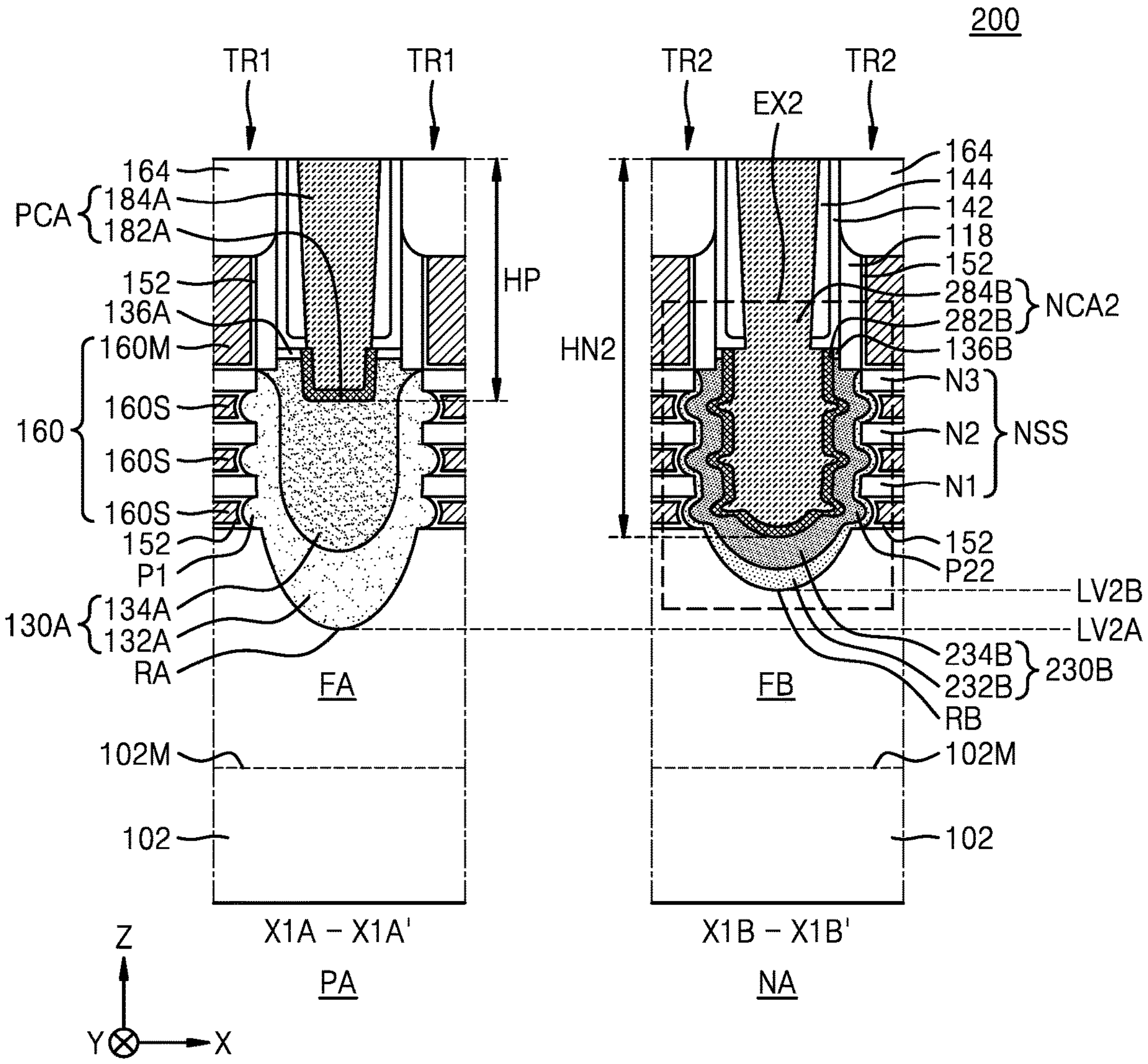
FIG. 5A illustrates cross-sectional views of portions of an integrated circuit device, which respectively correspond to the cross-sections taken along the lines X1A-X1A' and X1B-X1B' of FIG. 1, according to some embodiments of the present disclosure.
Figure 5B:
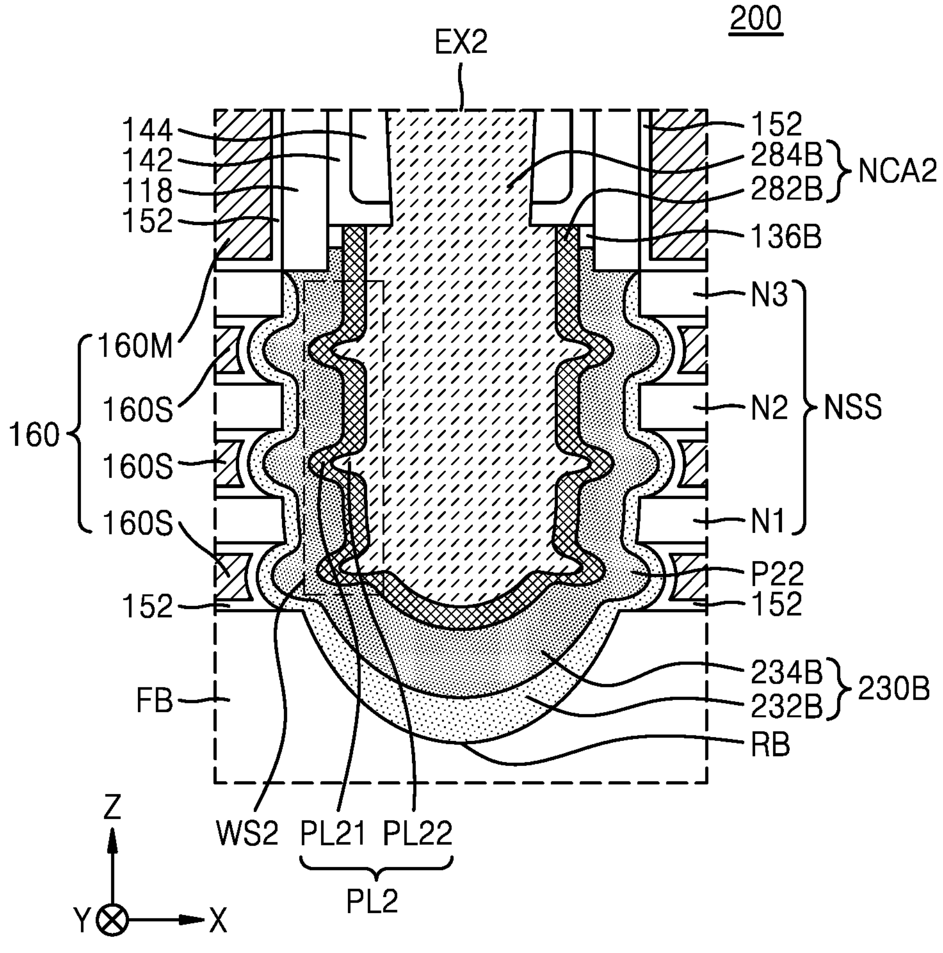
FIG. 5B is an enlarged cross-sectional view of some components, which are included in the region EX2 of FIG. 5A.

FIGS. 5A and 5B are cross-sectional views illustrating an integrated circuit device 200 according to some embodiments, and in particular, FIG. 5A illustrates cross-sectional views of portions of the integrated circuit device 200, which respectively correspond to the cross-sections taken along the lines X1A-X1A' and X1B-X1B' of FIG. 1, and FIG. 5B is an enlarged cross-sectional view of some components, which are included in the region EX2 of FIG. 5A. In FIGS. 5A and 5B, the same reference numerals as in FIGS. 1 and 2A to 2C respectively denote the same members, and here, repeated descriptions thereof are omitted.

Referring to FIGS. 5A and 5B, the integrated circuit device 200 may have substantially the same configuration as the integrated circuit device 100 described with reference to FIGS. 1 and 2A to 2C. However, the integrated circuit device 200 may include a second source/drain region 230B on the second recess RB of the second fin-type active region FB in the second area NA. The second source/drain region 230B may be in contact with a plurality of nanosheets (that is, N1, N2, and N3) that are above the second fin-type active region FB to be adjacent to the second source/drain region 230B. The second source/drain region 230B may face the sub-gate portion 160S of the gate line 160 adjacent thereto in the first horizontal direction (X direction). The second source/drain region 230B may include a second lower body layer 232B and a second upper body layer 234B, which are stacked in the stated order in the vertical direction (Z direction) on the surface of the second recess RB that is formed in the second fin-type active region FB. The configurations of the second lower body layer 232B and the second upper body layer 234B are substantially the same as those of the second lower body layer 132B and the second upper body layer 134B, which are described with reference to FIGS. 2A and 2C.

The second source/drain region 230B may include a plurality of protrusions P22 extending outward toward the sub-gate portions 160S of the gate line 160. The plurality of protrusions P22 may be portions of the second lower body layer 232B. The number of protrusions P22 in the second lower body layer 232B may correspond to the number of sub-gate portions 160S facing the second source/drain region 230B in the first horizontal direction (X direction).

In the second area NA, a second contact structure NCA2 may extend through the second insulating structure, which includes the insulating liner 142 and the inter-gate dielectric 144, and the second semiconductor capping layer 136B in the vertical direction (Z direction) to contact the second source/drain region 230B. In the second area NA, the second semiconductor capping layer 136B, the insulating liner 142, and the inter-gate dielectric 144 may surround a sidewall of the second contact structure NCA2.

In the vertical direction (Z direction), the first contact structure PCA may have the first length HP and the second contact structure NCA2 may have a second length HN2 that is greater than the first length HP of the first contact structure PCA. In some embodiments, the difference between the second length HN2 of the second contact structure NCA2 and the first length HP of the first contact structure PCA may be at least 10 nm. For example, the second length HN2 of the second contact structure NCA2 may be greater than the first length HP of the first contact structure PCA by about 10 nm to about 30 nm or about 15 nm to about 35 nm.

The second contact structure NCA2 may include a second metal silicide film 282B, which contacts the second source/drain region 230B, and a second conductive plug 284B, which is apart from the second source/drain region 230B with the second metal silicide film 282B therebetween. In the vertical direction (Z direction), the length of the second metal silicide film 282B may be greater than the length of the first metal silicide film 182A and the length of the second conductive plug 284B may be greater than the length of the first conductive plug 184A.

A portion of the second contact structure NCA2, which is buried in the second source/drain region 230B, may have a nonlinear-shaped portion WS2, which faces the plurality of nanosheets (that is, N1, N2, and N3) and the plurality of sub-gate portions 160S. The nonlinear-shaped portion WS2 may include a plurality of local protrusions PL2 extending to the outside of the second contact structure NCA2 toward the plurality of sub-gate portions 160S. Each of the plurality of local protrusions PL2 may include a local protrusion PL21 of the second metal silicide film 282B and a local protrusion PL22 of the second conductive plug 284B. The configurations of the second metal silicide film 282B and the second conductive plug 284B are substantially the same as those of the second metal silicide film 182B and the second conductive plug 184B, which are described with reference to FIGS. 2A and 2C.

Figure 6:
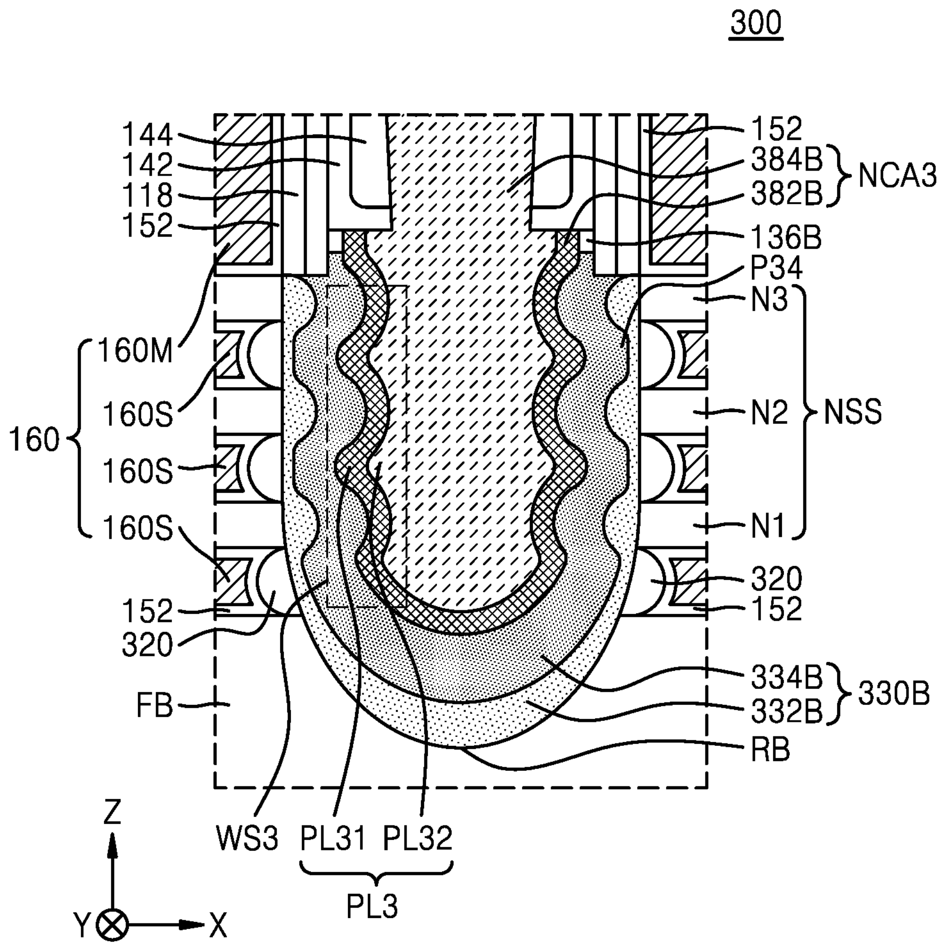
FIG. 6 is a cross-sectional view illustrating an integrated circuit device according to some embodiments of the present disclosure.

FIG. 6 is a cross-sectional view illustrating an integrated circuit device 300 according to some embodiments. FIG. 6 illustrates an enlarged cross-sectional configuration of some components of the integrated circuit device 300, which are included in the region EX1 of FIG. 2A. In FIG. 6, the same reference numerals as in FIGS. 1 and 2A to 2C respectively denote the same members, and here, repeated descriptions thereof are omitted.

Referring to FIG. 6, the integrated circuit device 300 may have substantially the same configuration as the integrated circuit device 100 described with reference to FIGS. 1 and 2A to 2C. However, the integrated circuit device 300 may include a second source/drain region 330B on the second recess RB of the second fin-type active region FB of the second area NA. The second source/drain region 330B may contact a plurality of nanosheets (that is, N1, N2, and N3) to be adjacent to the second source/drain region 330B. The second source/drain region 330B may face the sub-gate portion 160S of the gate line 160 adjacent thereto in the first horizontal direction (X direction). The second source/drain region 330B may include a second lower body layer 332B and a second upper body layer 334B, which are stacked in the stated order in the vertical direction (Z direction) on the surface of the second recess RB that is formed in the second fin-type active region FB. The configurations of the second lower body layer 332B and the second upper body layer 334B are substantially the same as those of the second lower body layer 132B and the second upper body layer 134B, which are described with reference to FIGS. 2A and 2C.

The integrated circuit device 300 may include a plurality of inner insulating spacers 320 between the second source/drain region 330B and the sub-gate portions 160S of the gate line 160. Each of the plurality of inner insulating spacers 320 may contact the second source/drain region 330B. The plurality of inner insulating spacers 320 may be respectively arranged one-by-one between the plurality of nanosheets (that is, N1, N2, and N3). The gate dielectric film 152 may be between an inner insulating spacer 320 and the sub-gate portion 160S. Each of the plurality of inner insulating spacers 320 may include silicon nitride, silicon oxide, SiCN, SiBN, SiON, SiOCN, SiBCN, SiOC, or a combination thereof.

The second upper body layer 334B of the second source/drain region 330B may include a plurality of protrusions P34 extending outward toward the sub-gate portions 160S of the gate line 160 adjacent thereto and toward the plurality of inner insulating spacers 320. The number of protrusions P34 in the second upper body layer 334B may correspond to the number of sub-gate portions 160S facing the second source/drain region 330B in the first horizontal direction (X direction).

In the second area NA, a second contact structure NCA3 may extend through the second insulating structure, which includes the insulating liner 142 and the inter-gate dielectric 144, and the second semiconductor capping layer 136B in the vertical direction (Z direction) to contact the second source/drain region 330B. In the second area NA, the second semiconductor capping layer 136B, the insulating liner 142, and the inter-gate dielectric 144 may surround a sidewall of the second contact structure NCA3.

The configuration of the second contact structure NCA3 is substantially the same as that of the second contact structure NCA described with reference to FIGS. 2A and 2C. However, the second contact structure NCA3 may include a second metal silicide film 382B, which contacts the second source/drain region 330B, and a second conductive plug 384B, which is apart from the second source/drain region 330B with the second metal silicide film 382B therebetween. In the vertical direction (Z direction), the length of the second metal silicide film 382B may be greater than the length of the first metal silicide film 182A (see FIG. 2A) and the length of the second conductive plug 384B may be greater than the length of the first conductive plug 184A (see FIG. 2A).

A portion of the second contact structure NCA3, which is buried in the second source/drain region 330B, may have a nonlinear-shaped portion WS3, which faces the plurality of nanosheets (that is, N1, N2, and N3) and the plurality of sub-gate portions 160S. The nonlinear-shaped portion WS3 may include a plurality of local protrusions PL3 extending to the outside of the second contact structure NCA3 toward the plurality of sub-gate portions 160S and the plurality of inner insulating spacers 320. Each of the plurality of local protrusions PL3 may include a local protrusion PL31 of the second metal silicide film 382B and a local protrusion PL32 of the second conductive plug 384B. The configurations of the second metal silicide film 382B and the second conductive plug 384B are substantially the same as those of the second metal silicide film 182B and the second conductive plug 184B, which are described with reference to FIGS. 2A and 2C.

Figure 7:
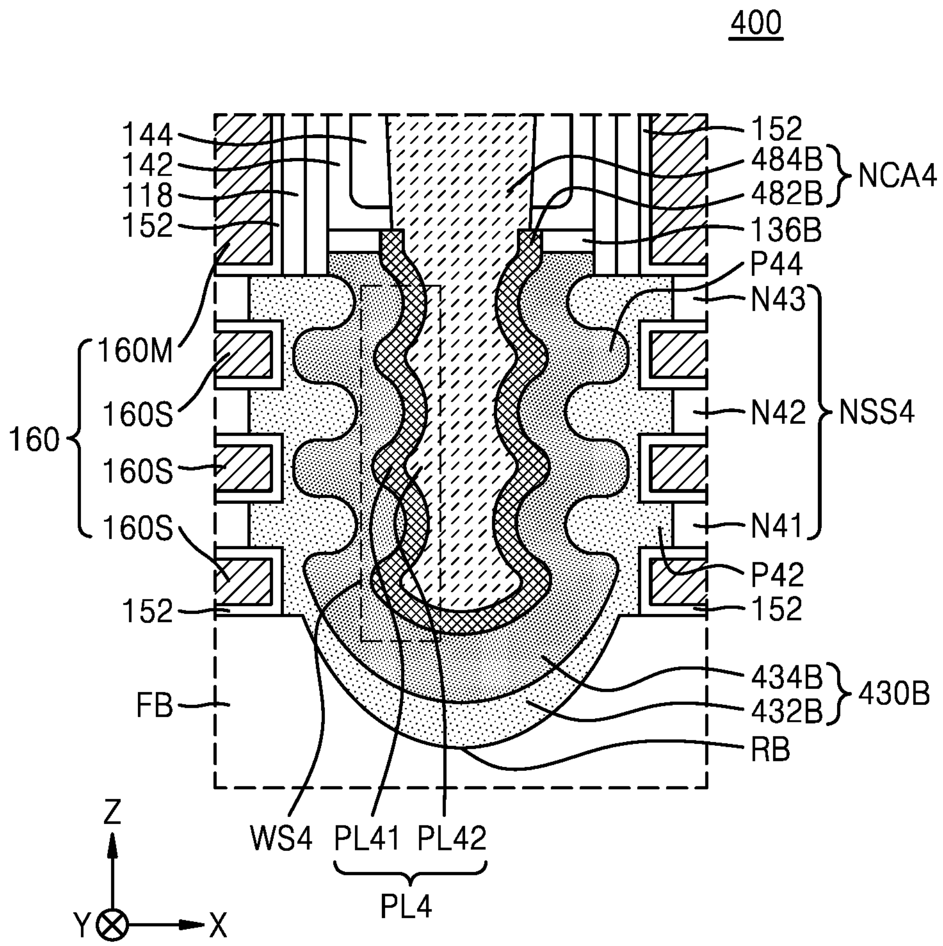
FIG. 7 is a cross-sectional view illustrating an integrated circuit device according to some embodiments of the present disclosure.

FIG. 7 is a cross-sectional view illustrating an integrated circuit device 400 according to some embodiments. FIG. 7 illustrates an enlarged cross-sectional configuration of some components of the integrated circuit device 400, which are included in the region EX1 of FIG. 2A. In FIG. 7, the same reference numerals as in FIGS. 1 and 2A to 2C respectively denote the same members, and here, repeated descriptions thereof are omitted.

Referring to FIG. 7, the integrated circuit device 400 may have substantially the same configuration as the integrated circuit device 100 described with reference to FIGS. 1 and 2A to 2C. However, the integrated circuit device 400 may include a nanosheet stack NSS4, which is above the second fin-type active region FB in the second area NA, and a second source/drain region 430B, which is on the second recess RB of the second fin-type active region FB in the second area NA.

The nanosheet stack NSS4 may include a plurality of nanosheets (that is, N41, N42, and N43) overlapping each other in the vertical direction (Z direction) over the second fin-type active region FB. The configurations of the plurality of nanosheets (that is, N41, N42, and N43) are substantially the same as those of the plurality of nanosheets (that is, N1, N2, and N3), which are described with reference to FIGS.

2A and 2C. However, in the first horizontal direction (X direction), the width of each of the plurality of nanosheets (that is, N41, N42, and N43) may be less than the width of each of the plurality of sub-gate portions 160S.

The second source/drain region 430B may contact the plurality of nanosheets (that is, N41, N42, and N43) above the second fin-type active region FB to be adjacent to the second source/drain region 430B. The second source/drain region 430B may face the sub-gate portions 160S of the gate line 160 adjacent thereto and the plurality of nanosheets (that is, N41, N42, and N43) in the first horizontal direction (X direction). The second source/drain region 430B may include a second lower body layer 432B and a second upper body layer 434B, which are stacked in the stated order in the vertical direction (Z direction) on the surface of the second recess RB that is formed in the second fin-type active region FB. The configurations of the second lower body layer 432B and the second upper body layer 434B are substantially the same as those of the second lower body layer 132B and the second upper body layer 134B, which are described with reference to FIGS. 2A and 2C. However, the second lower body layer 432B may include a plurality of protrusions P42 extending outward toward the plurality of nanosheets (that is, N41, N42, and N43) and the second upper body layer 434B may include a plurality of protrusions P44 extending outward toward the plurality of sub-gate portions 160S.

In the second area NA, a second contact structure NCA4 may extend through the second insulating structure, which includes the insulating liner 142 and the inter-gate dielectric 144, and the second semiconductor capping layer 136B in the vertical direction (Z direction) to contact the second source/drain region 430B. In the second area NA, the second semiconductor capping layer 136B, the insulating liner 142, and the inter-gate dielectric 144 may surround a sidewall of the second contact structure NCA4.

The configuration of the second contact structure NCA4 is substantially the same as that of the second contact structure NCA described with reference to FIGS. 2A and 2C. However, the second contact structure NCA4 may include a second metal silicide film 482B, which contacts the second source/drain region 430B, and a second conductive plug 484B, which is apart from the second source/drain region 430B with the second metal silicide film 482B therebetween.

A portion of the second contact structure NCA4, which is buried in the second source/drain region 430B, may have a nonlinear-shaped portion WS4, which faces the plurality of nanosheets (N41, N42, and N43) and the plurality of sub-gate portions 160S. The nonlinear-shaped portion WS4 may include a plurality of local protrusions PL4 extending to the outside of the second contact structure NCA4 toward the plurality of sub-gate portions 160S. Each of the plurality of local protrusions PL4 may include a local protrusion PL41 of the second metal silicide film 482B and a local protrusion PL42 of the second conductive plug 484B. The configurations of the second metal silicide film 482B and the second conductive plug 484B are substantially the same as those of the second metal silicide film 182B and the second conductive plug 184B, which are described with reference to FIGS. 2A and 2C.

In the first horizontal direction (X direction), the minimum distance between the second contact structure NCA4 and each of the plurality of nanosheets (that is, N41, N42, and N43) may be greater than the minimum distance between the second contact structure NCA4 and the sub-gate portion 160S.

Figure 8:
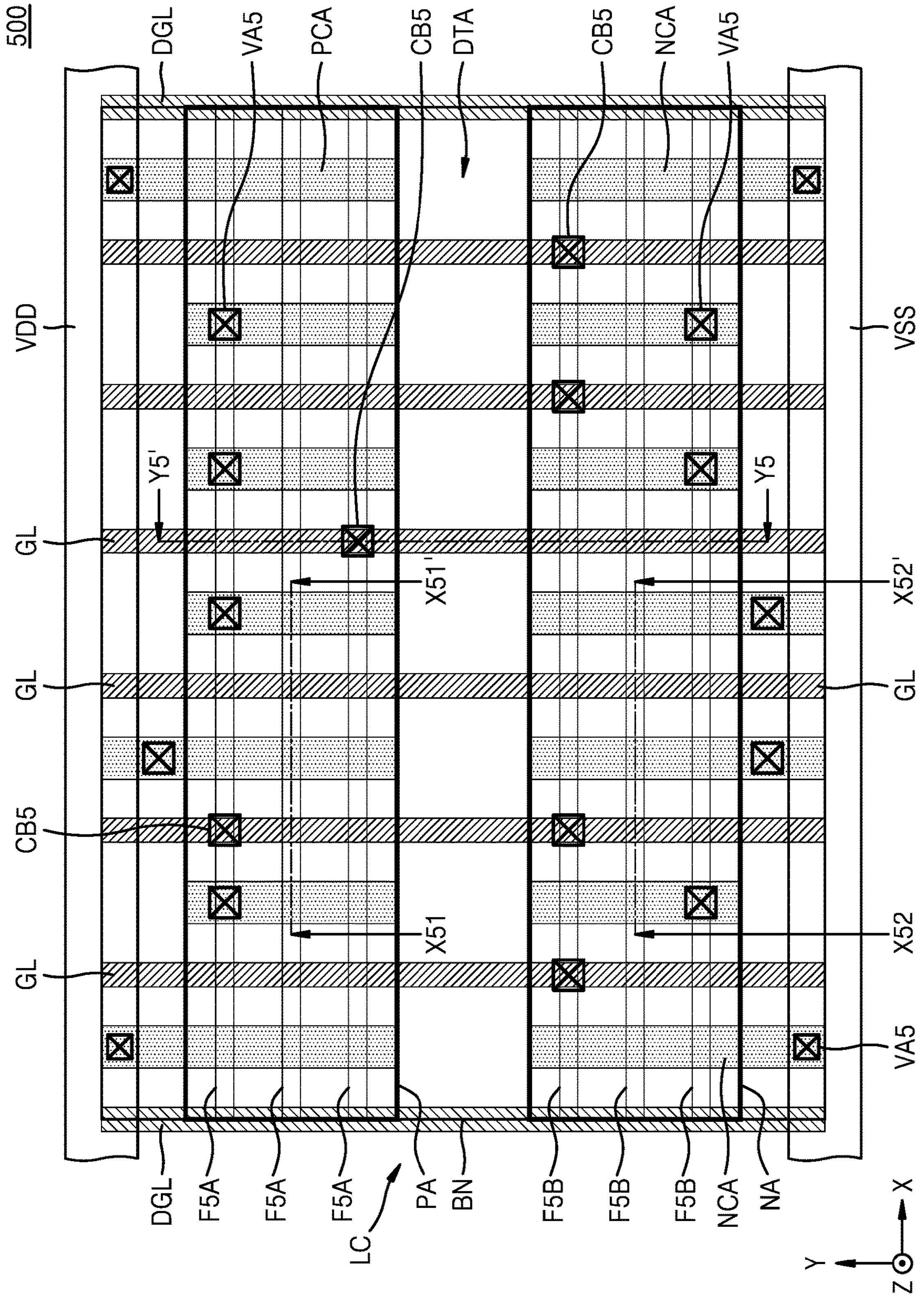
FIG. 8 is a planar layout diagram illustrating an integrated circuit device according to some embodiments of the present disclosure.
Figure 9A:
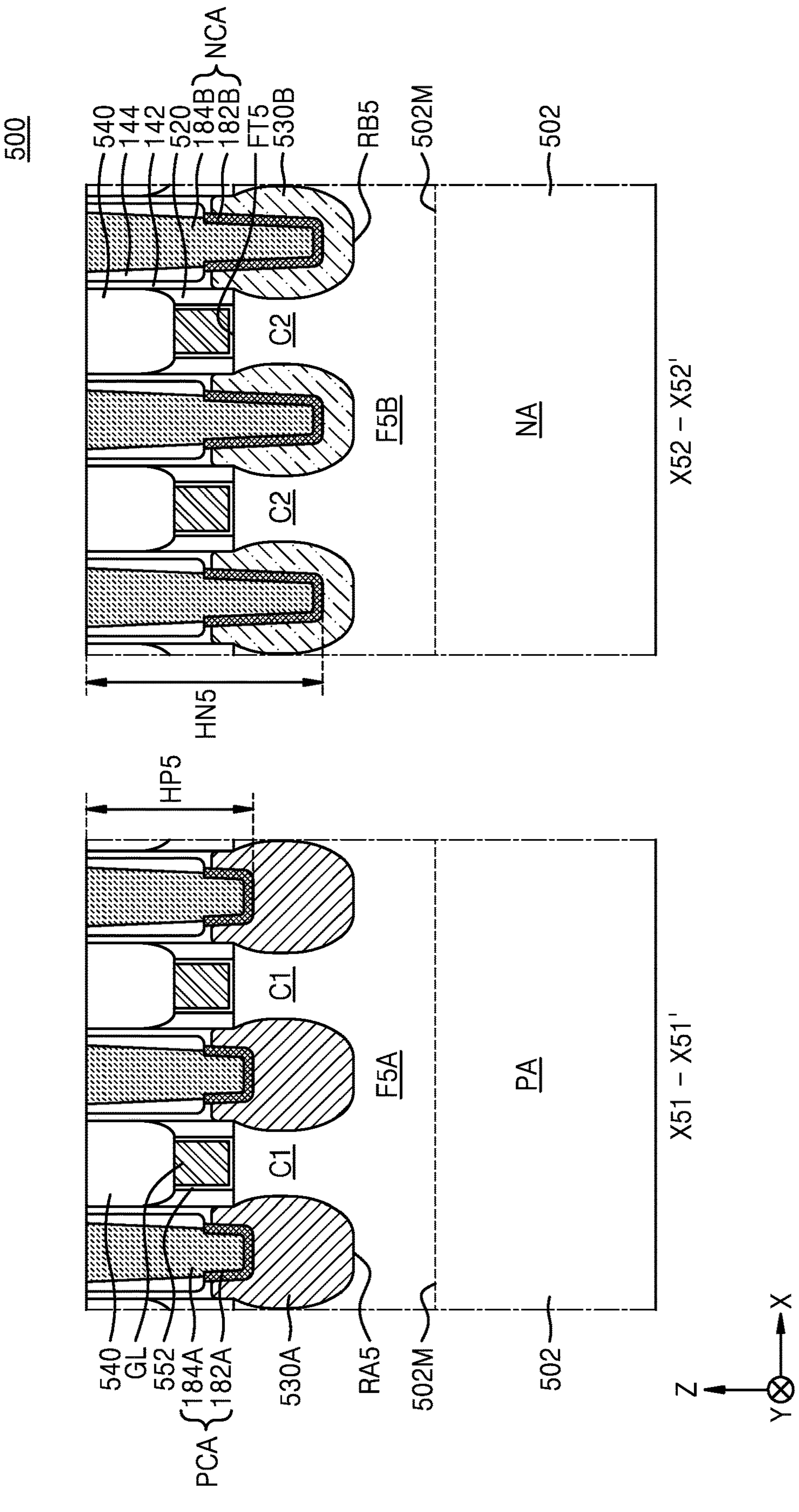
FIG. 9A illustrates cross-sectional views of some components, respectively taken along the lines X51-X51' and X52-X52' of FIG. 8.
Figure 9B:
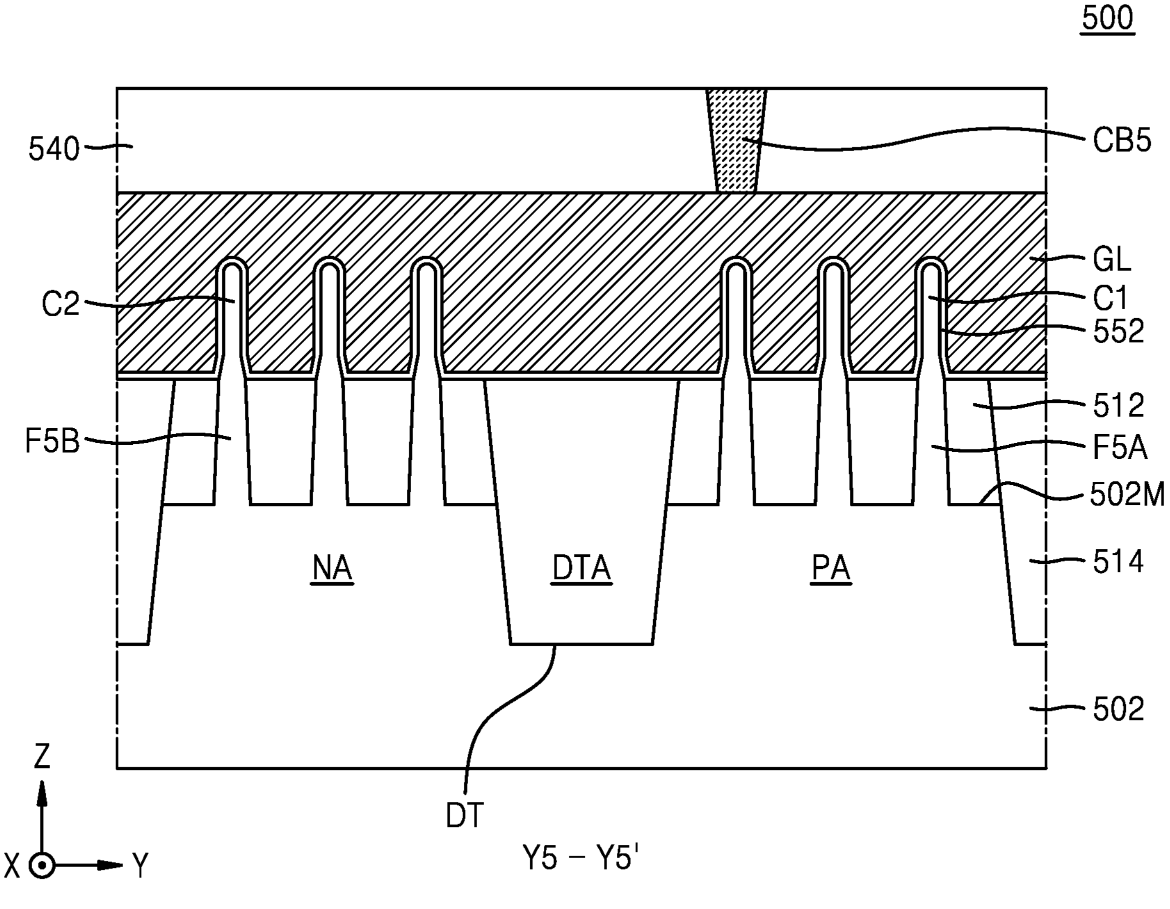
FIG. 9B illustrates a cross-sectional view of some components, taken along the line Y5-Y5' of FIG. 8.

FIG. 8 is a planar layout diagram illustrating an integrated circuit device 500 according to some embodiments. FIG. 9A illustrates cross-sectional views of some components, respectively taken along the lines X51-X51' and X52-X52' of FIG. 8, and FIG. 9B illustrates a cross-sectional view of some components, taken along the line Y5-Y5' of FIG. 8. In FIGS. 8, 9A, and 9B, the same reference numerals as in FIGS. 1 and 2A to 2C respectively denote the same members, and here, repeated descriptions thereof are omitted.

Referring to FIGS. 8, 9A, and 9B, the integrated circuit device 500 may constitute a logic cell including a fin field-effect transistor (FinFET) device. The integrated circuit device 500 may include a logic cell LC, which is formed in a region defined by a cell boundary BN, on a substrate 510.

The substrate 510 may have a main surface 502M extending in the horizontal direction (X-Y plane direction). The substrate 510 may have substantially the same configuration as the substrate 102 described with reference to FIGS. 2A and 2B.

The logic cell LC may include a first area PA and a second area NA. The first area PA may include an NMOS transistor area and the second area NA may include a PMOS transistor area. A plurality of first fin-type active regions F5A may be on the first area PA of the substrate 102 and a plurality of second fin-type active regions F5B may be on the second area NA of the substrate 102. A plurality of first and second fin-type active regions F5A and F5B may extend parallel to each other in a width direction of the logic cell LC, that is, the first horizontal direction (X direction).

A first channel region C1 may be on a first fin-type active region F5A and integrally connected to the first fin-type active region F5A. A second channel region C2 may be on a second fin-type active region F5B and integrally connected to the second fin-type active region F5B.

As shown in FIG. 9B, a device isolation film 512 may be on the substrate 502 in the first area PA and the second area NA. The device isolation film 512 may be on and/or cover a lower sidewall of each of the plurality of first and second fin-type active regions F5A and F5B. An inter-device isolation region DTA may be between the first area PA and the second area NA. A deep trench DT may be formed in the inter-device isolation region DTA to define the first area PA and the second area NA, and the deep trench DT may be filled with an inter-device isolation insulating film 514. Each of the device isolation film 512 and the inter-device isolation insulating film 514 may include a silicon oxide film, a silicon nitride film, or a combination thereof.

A plurality of gate dielectric films 522 and a plurality of gate lines GL may extend, on or over the substrate 502 in the second horizontal direction (Y direction) that intersects with the plurality of first and second fin-type active regions F5A and F5B. The plurality of gate dielectric films 522 and the plurality of gate lines GL may respectively surround a plurality of first and second channel regions C1 and C2 and may be on and/or cover au upper surface of the device isolation film 512 and an upper surface of the inter-device isolation insulating film 514. Respective constituent materials of a gate dielectric film 552 and a gate line GL are substantially the same as those of the gate dielectric film 152 and the gate line 160, which are described with reference to FIGS. 2A to 2C.

In the first area PA and the second area NA, a plurality of three-dimensional MOS transistors may be formed along each of the plurality of gate lines GL. In some embodiments, the first area PA may include a PMOS transistor area, and a plurality of PMOS transistors may be respectively formed in intersection areas between the first fin-type active regions F5A and the gate lines GL in the first area PA. The second area NA may include an NMOS transistor area, and a plurality of NMOS transistors may be respectively formed in intersection areas between the second fin-type active regions F5B and the gate lines GL in the second area NA.

A dummy gate line DGL may extend along a portion of the cell boundary BN, which extends in the second horizontal direction (Y direction). The dummy gate line DGL may include the same material as each of the plurality of gate lines GL. The dummy gate line DGL may be maintained in an electrically floating state during the operation of the integrated circuit device 500, thereby functioning as an electrical isolation region between the logic cell LC and another logic cell adjacent thereto.

A plurality of insulating spacers 520 may each be on and/or cover both sidewalls of each of the plurality of gate lines GL and a plurality of dummy gate lines DGL. A capping insulating pattern 540 may be on and/or cover the plurality of gate lines GL, the plurality of dummy gate lines DGL, the plurality of gate dielectric films 552, and the plurality of insulating spacers 520. Each of the capping insulating pattern 540 and the plurality of insulating spacers 520 may extend in a line shape in the second horizontal direction (Y direction). Respective constituent materials of the plurality of insulating spacers 520 and a plurality of capping insulating patterns 540 are substantially the same as those of the outer insulating spacer 118 and the capping insulating pattern 164, which are described with reference to FIGS. 2A to 2C.

A plurality of recess regions RA5 may be formed in an upper surface of the first fin-type active region F5A, and a plurality of first source/drain regions 530A may be respectively on the plurality of recess regions RA5. A plurality of recess regions RB5 may be formed in an upper surface of the second fin-type active region F5B, and a plurality of second source/drain regions 530B may be on the plurality of recess regions RB5. Respective constituent materials of a first source/drain region 530A and a second source/drain region 530B are substantially the same as those of the first source/drain region 130A and the second source/drain region 130B, which are described with reference to FIGS. 2A and 2C. The size and shape of each of the plurality of first source/drain regions 530A and the plurality of second source/drain regions 530B are not limited to the example shown in FIG. 9A. Each of the plurality of first source/drain regions 530A of the first area PA and each of the plurality of second source/drain regions 530B of the second area NA may have different shapes and sizes from each other.

The insulating liner 142 and the inter-gate dielectric 144 may be arranged in the stated order on each of the plurality of first source/drain regions 530A and the plurality of second source/drain regions 530B. The insulating liner 142 and the inter-gate dielectric 144 may constitute an insulating structure.

In the first area PA, a first contact structure PCA may extend through a first insulating structure, which includes the insulating liner 142 and the inter-gate dielectric 144, in the vertical direction (Z direction) to contact the first source/drain region 530A. The first contact structure PCA may include a first metal silicide film 182A, which contacts the first source/drain region 530A, and a first conductive plug 184A, which is apart from the first source/drain region 530A with the first metal silicide film 182A therebetween.

In the second area NA, a second contact structure NCA may extend through a second insulating structure, which includes the insulating liner 142 and the inter-gate dielectric 144, in the vertical direction (Z direction) to contact the second source/drain region 530B. The second contact structure NCA may include a second metal silicide film 182B, which contacts the second source/drain region 530B, and a second conductive plug 184B, which is apart from the second source/drain region 530B with the second metal silicide film 182B therebetween. In the vertical direction (Z direction), the length of the second metal silicide film 182B may be greater than the length of the first metal silicide film 182A and the length of the second conductive plug 184B may be greater than the length of the first conductive plug 184A.

In the vertical direction (Z direction), the first contact structure PCA may have a first length HP5 and the second contact structure NCA may have a second length HN5 that is greater than the first length HP5 of the first contact structure PCA. In some embodiments, the difference between the second length HN5 of the second contact structure NCA and the first length HP5 of the first contact structure PCA may be at least 10 nm. For example, the second length HN5 of the second contact structure NCA may be greater than the first length HP5 of the first contact structure PCA by about 10 nm to about 30 nm or about 15 nm to about 35 nm.

As shown in FIG. 8, a plurality of via contacts VA5 may be on a plurality of first contact structures PCA and a plurality of second contact structures NCA. In addition, a gate contact CB5 may be horizontally spaced apart from each of the plurality of via contacts VA5. As shown in FIG. 9B, the gate contact CB5 may extend through the capping insulating pattern 540 in the vertical direction (Z direction) to be connected to the gate line GL. Each of the via contact VA5 and the gate contact CB5 may include, but is not limited to, Ti, Ta, TiN, TaN, W, Co, Mo, Cu, Ru, Mn, or a combination thereof.

FIG. 9A illustrates an example of a configuration in which the plurality of first contact structures PCA and the plurality of second contact structures NCA are arranged in the first area PA and the second area NA of the integrated circuit device 500, respectively, but the present disclosure is not limited thereto. For example, in the second area NA of the integrated circuit device 500, the second contact structure NCA2 described with reference to FIGS. 5A and 5B, the second contact structure NCA3 described with reference to FIG. 6, the second contact structure NCA4 described with reference to FIG. 7, or a second contact structure variously modified and changed therefrom without departing from the spirit and scope of the present disclosure may be arranged.

As shown in FIG. 8, in the logic cell LC, a power line VDD may be connected to some first contact structures PCA selected from the plurality of first contact structures PCA in the first area PA and a ground line VSS may be connected to some second contact structures NCA selected from the plurality of second contact structures NCA.

In each of the integrated circuit devices 100A, 100B, 200, 300, 400, and 500 described with reference to FIGS. 3 to 9B, and similar to the integrated circuit device 100 described with reference to FIGS. 1 and 2A to 2C, the length of the second contact structure NCA, NCA2, NCA3, or NCA4 in the second area NA may be greater in the vertical direction (Z direction) than the length of the first contact structure PCA in the first area PA. Therefore, in the second area NA, the contact area between the second source/drain region 130B, 230B, 330B, 430B, or 530B and the second contact structure NCA, NCA2, NCA3, or NCA4 may be increased, thereby reducing the contact resistance therebetween. Therefore, even when the area of a device region is reduced along with the down-scaling of each of the integrated circuit devices 100A, 100B, 200, 300, 400, and 500, different electrical characteristics respectively desired by the channel types of transistors, which are formed on the substrate 102 or 502, may be achieved, and the reliability of each of the integrated circuit devices 100A, 100B, 200, 300, 400, and 500 may improve.

Figure 10:
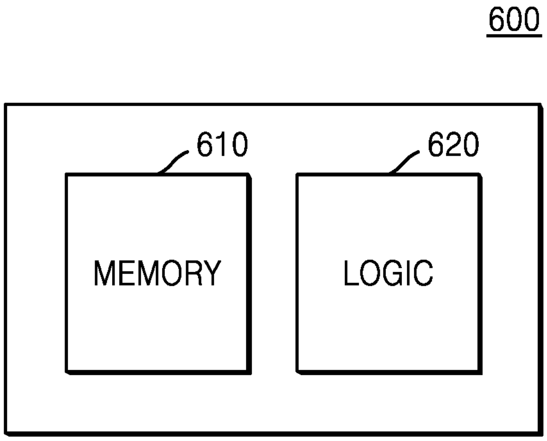
FIG. 10 is a block diagram of an integrated circuit device according to some embodiments of the present disclosure.

FIG. 10 is a block diagram of an integrated circuit device 600 according to some embodiments.

Referring to FIG. 10, the integrated circuit device 600 may include a memory region 610 and a logic region 620. At least one of the memory region 610 and the logic region 620 may include at least one of the configurations of the integrated circuit devices 100, 100A, 100B, 200, 300, 400, and 500 described with reference to FIGS. 1 to 9B.

The memory region 610 may include at least one of static random access memory (SRAM), dynamic RAM (DRAM), magnetic RAM (MRAM), resistive RAM (RRAM), and phase-change RAM (PRAM). For example, the memory region 610 may include SRAM. The logic region 620 may include standard cells configured to perform intended logical functions, such as a counter, a buffer, and the like. The standard cells may include various logic cells including a plurality of circuit elements, such as a transistor, a register, and the like. A logic cell may include, for example, AND, NAND, OR, NOR, exclusive OR (XOR), exclusive NOR (XNOR), an inverter (INV), an adder (ADD), a buffer (BUF), a delay (DLY), a filter (FIL), a multiplexer (MXT/MXIT), OR/AND/INVERTER (OAI), AND/OR (AO), AND/OR/INVERTER (AOI), a D flip-flop, a reset flip-flop, a master-slave flip-flop, a latch, or the like.

FIGS. 11A to 11L are cross-sectional views respectively illustrating a sequence of processes of a method of fabricating an integrated circuit device according to some embodiments. FIGS. 11A to 11L each illustrate cross-sectional configurations respectively corresponding to the cross-sections taken along the lines XIA-X1A' and X1B-X1B' of FIG. 1, according to the sequence of processes. An example of a method of fabricating the integrated circuit device 100 described with reference to FIGS. 1 and 2A to 2C is described with reference to FIGS. 11A to 11L. In FIGS. 11A to 11L, the same reference numerals as in FIGS. 1 and 2A to 2C respectively denote the same members, and here, repeated descriptions thereof are omitted.

Figure 11A:
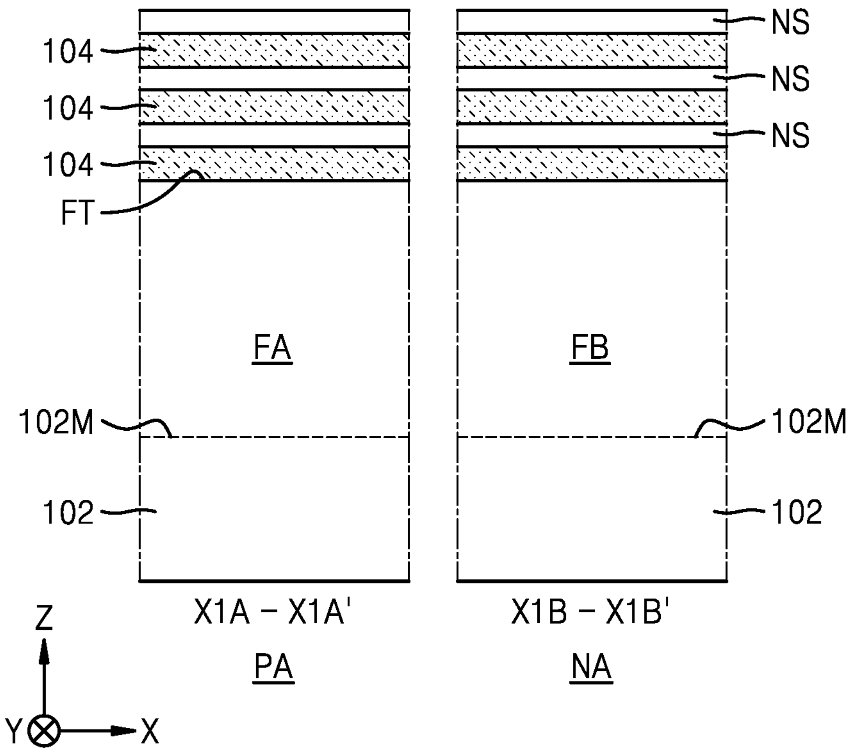
FIGS. 11A, 11B, 11C, 11D, 11E, 11F, 11G, 11H, 11I, 11J, 11K, and 11L are cross-sectional views illustrating a sequence of processes of a method of fabricating an integrated circuit device according to some embodiments of the present disclosure.

Referring to FIG. 11A, a plurality of sacrificial semiconductor layers 104 and a plurality of nanosheet semiconductor layers NS may be alternately stacked one-by-one on the substrate 102 having the first area PA and the second area NA, followed by partially etching the plurality of sacrificial semiconductor layers 104, the plurality of nanosheet semiconductor layers NS, and the substrate 102, thereby forming the first fin-type active region FA on the first area PA of the substrate 102 and forming the second fin-type active region FB on the second area NA of the substrate 102. Next, the device isolation film 114 (see FIG. 2B) may be formed on the substrate 102 to cover the sidewall each of the first fin-type active region FA and the second fin-type active region FB. A stack structure of the plurality of sacrificial semiconductor layers 104 and the plurality of nanosheet semiconductor layers NS may remain on the fin top surface FT of each of the first fin-type active region FA and the second fin-type active region FB.

Each of the plurality of sacrificial semiconductor layers 104 and each of the plurality of nanosheet semiconductor layers NS may respectively include semiconductor materials having different etch selectivities from each other. In some embodiments, each of the plurality of nanosheet semiconductor layers NS may include an Si layer and each of the plurality of sacrificial semiconductor layers 104 may include an SiGe layer. In some embodiments, the Ge content in the plurality of sacrificial semiconductor layers 104 may be constant. The SiGe layer constituting each of the plurality of sacrificial semiconductor layers 104 may have constant Ge content selected from a range of about 5 at % to about 60 at %, for example, about 10 at % to about 55 at %. The Ge content in the SiGe layer constituting each of the plurality of sacrificial semiconductor layers 104 may be variously selected as needed.

Figure 11B:
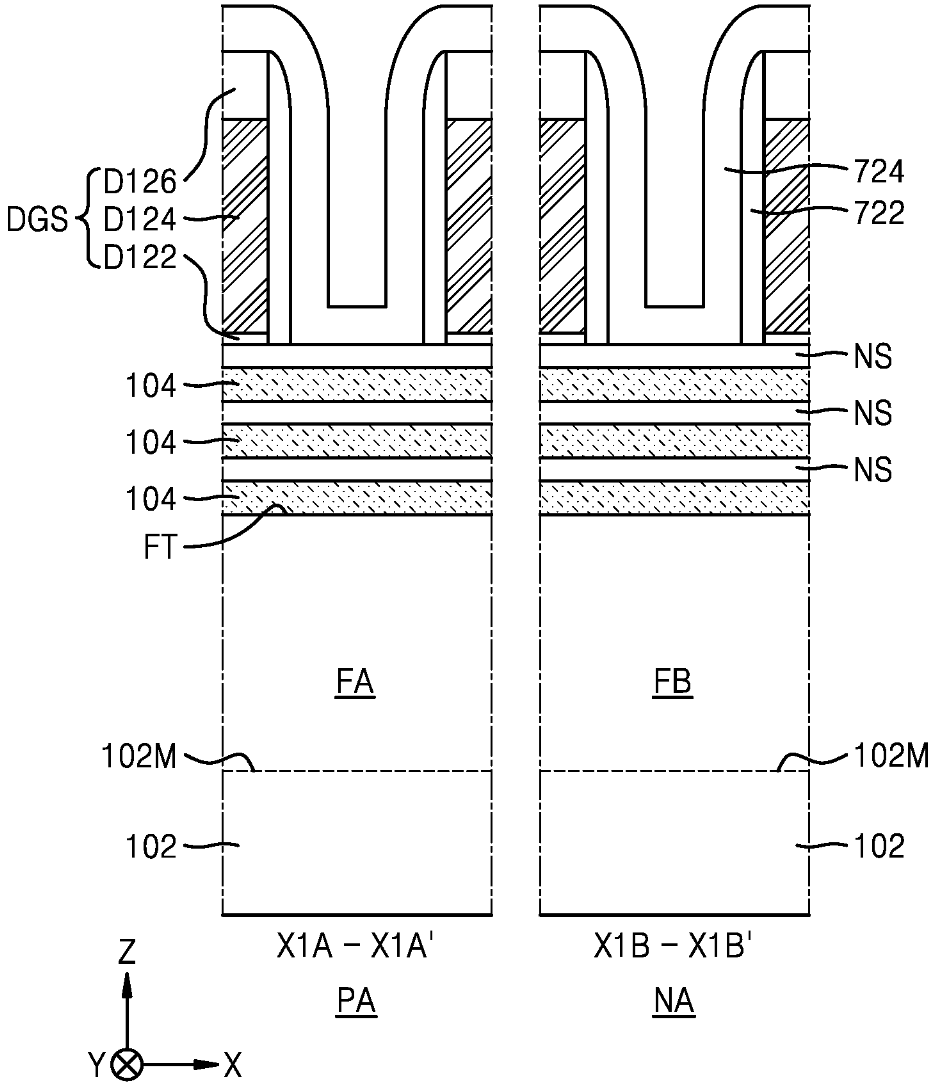

Referring to FIG. 11B, in the first area PA and the second area NA, a plurality of dummy gate structures DGS may be formed on the stack structure of the plurality of sacrificial semiconductor layers 104 and the plurality of nanosheet semiconductor layers NS. Each of the plurality of dummy gate structures DGS may be formed to extend lengthwise in the second horizontal direction (Y direction). Each of the plurality of dummy gate structures DGS may have a structure in which an oxide film D122, a dummy gate layer D124, and a capping layer D126 are stacked in the stated order. In some embodiments, the dummy gate layer D124 may include polysilicon and the capping layer D126 may include a silicon nitride film.

Next, an inner insulating spacer film 722 may be formed to cover both sidewalls of a dummy gate structure DGS, and then, an outer insulating spacer film 724 may be formed to cover the first and second fin-type active regions FA and FB, the dummy gate structure DGS, and the inner insulating spacer film 722. The inner insulating spacer film 722 may include a silicon nitride (SiN) film. The outer insulating spacer film 724 may include an SiN film, an SiOCN film, an SiCN film, an SiOC film, or a combination thereof.

Figure 11C:
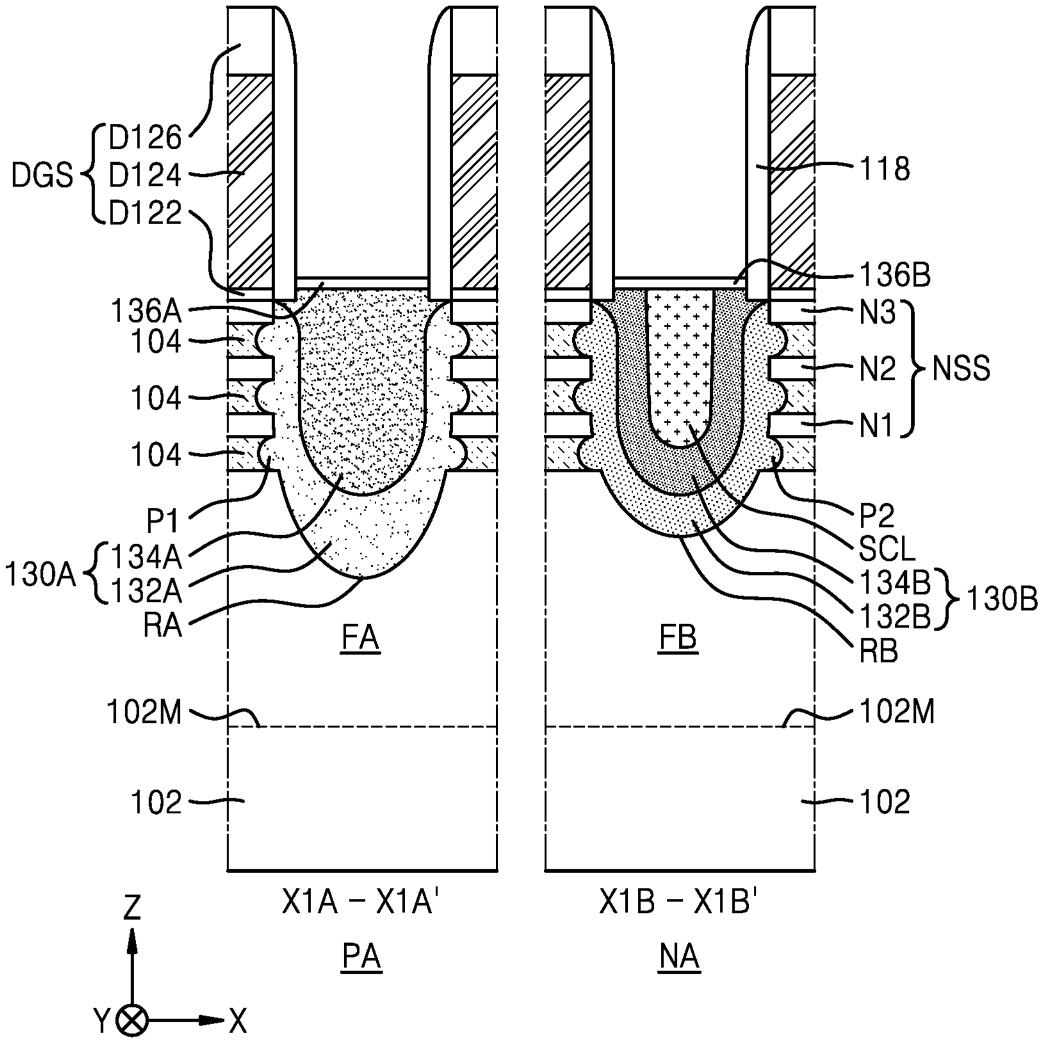

Referring to FIG. 11C, in the resulting product of FIG. 11B, by etching a portion of the outer insulating spacer film 724 in the first area PA while the second area NA is covered by a first mask pattern (not shown), the outer insulating spacer 118, which covers both sidewalls of the dummy gate structure DGS, may be formed from the inner insulating spacer film 722 and the outer insulating spacer film 724, and the resulting exposed portion of the stack structure of the plurality of sacrificial semiconductor layers 104 and the plurality of nanosheet semiconductor layers NS and the exposed portion of the first fin-type active region FA may be etched, thereby forming the nanosheet stack NSS and the first recess RA. Next, the first source/drain region 130A may be formed on the first recess RA by performing an epitaxial growth process on the first fin-type active region FA and the plurality of nanosheets (that is, N1, N2, and N3), both exposed at the first recess RA.

In some embodiments, during the etching of the stack structure of the plurality of sacrificial semiconductor layers 104 and the plurality of nanosheet semiconductor layers NS in the first area PA, etching conditions may be controlled such that the amount of etching of the plurality of sacrificial semiconductor layers 104 is greater than the amount of etching of the plurality of nanosheet semiconductor layers NS, thereby allowing a sidewall of each of the plurality of sacrificial semiconductor layers 104 to be recessed more than a sidewall of each of the plurality of nanosheet semiconductor layers NS. By forming the first source/drain region 130A under such a condition, the first lower body layer 132A including the plurality of protrusions P1, which extend toward the plurality of sacrificial semiconductor layers 104, may be obtained.

Referring continuously to FIG. 11C, the first semiconductor capping layer 136A may be formed on the first source/drain region 130A, followed by removing the first mask pattern, and then, the outer insulating spacer film 724 in the second area NA may be partially etched while the first area PA is covered by a second mask pattern (not shown), thereby forming the outer insulating spacer 118 from the inner insulating spacer film 722 and the outer insulating spacer film 724 to cover both sidewalls of the dummy gate structure DGS. Next, the resulting exposed portion of the stack structure of the plurality of sacrificial semiconductor layers 104 and the plurality of nanosheet semiconductor layers NS and the exposed portion of the second fin-type active region FB may be etched, thereby forming the nanosheet stack NSS, which includes a plurality of nanosheets (that is, N1, N2, and N3), and the second recess RB, and then, the second source/drain region 130B may be formed on the second recess RB by performing an epitaxial growth process on the second fin-type active region FB and the plurality of nanosheets (that is, N1, N2, and N3), both exposed at the second recess RA. The upper surface of the second source/drain region 130B may have a concave surface that defines a sacrificial space.

In some embodiments, during the etching of the stack structure of the plurality of sacrificial semiconductor layers 104 and the plurality of nanosheet semiconductor layers NS of the second area NA, etching conditions may be controlled such that the amount of etching of the plurality of sacrificial semiconductor layers 104 is greater than the amount of etching of the plurality of nanosheet semiconductor layers NS, thereby allowing a sidewall of each of the plurality of sacrificial semiconductor layers 104 to be recessed more than a sidewall of each of the plurality of nanosheet semiconductor layers NS. By forming the second source/drain region 130B under such a condition, the second lower body layer 132B including the plurality of protrusions P2, which extend toward the plurality of sacrificial semiconductor layers 104, may be obtained.

Next, a sacrificial film SCL may be formed on the second source/drain region 130B to fill the sacrificial space. The sacrificial film SCL may include an $Si_{1-x}Ge_x$ layer (where $0.6<x<1$) or a Ge layer. When the sacrificial film SCL includes an $Si_{1-x}Ge_x$ layer, the Ge content in the sacrificial film SCL may be greater than the Ge content in the first upper body layer 134A of the first source/drain region 130A. For example, the Ge content in the sacrificial film SCL may be greater than about 65 at % and less than or equal to about 100 at %, for example, may be greater than or equal to about 70 at % and less than or equal to about 100 at %. In some embodiments, the sacrificial film SCL may further include an impurity element. The impurity element, which may be included in the sacrificial film SCL, may include, but is not limited to, carbon (C), boron (B), phosphorus (P), arsenic (As), antimony (Sb), or a combination thereof.

Next, the second semiconductor capping layer 136B may be formed to cover an upper surface of the sacrificial film SCL. The density of the second semiconductor capping layer 136B may be less than the density of the second source/drain region 130B. In some embodiments, the second semiconductor capping layer 136B may include a porous structure having a plurality of pores and each of the plurality of pores may have a size that enables an Si atom and/or a Ge atom to pass through. In some embodiments, to form the second semiconductor capping layer 136B, a low pressure chemical vapor deposition (LPCVD) process may be performed at a relatively low process temperature. For example, to form the second semiconductor capping layer 136B, a silicon film may be formed by performing an LPCVD process at a temperature of about 630° C. or less, but the present disclosure is not limited thereto.

The above description is made by taking an example in which, to form the resulting product of FIG. 11C, the first source/drain region 130A is formed first in the first area PA, and then, the second source/drain region 130B and the sacrificial film SCL are formed in the second area NA, but the present disclosure is not limited thereto. For example, the second source/drain region 130B and the sacrificial film SCL may be formed first in the second area NA, and then, the first source/drain region 130A may be formed in the first area PA.

Figure 11D:
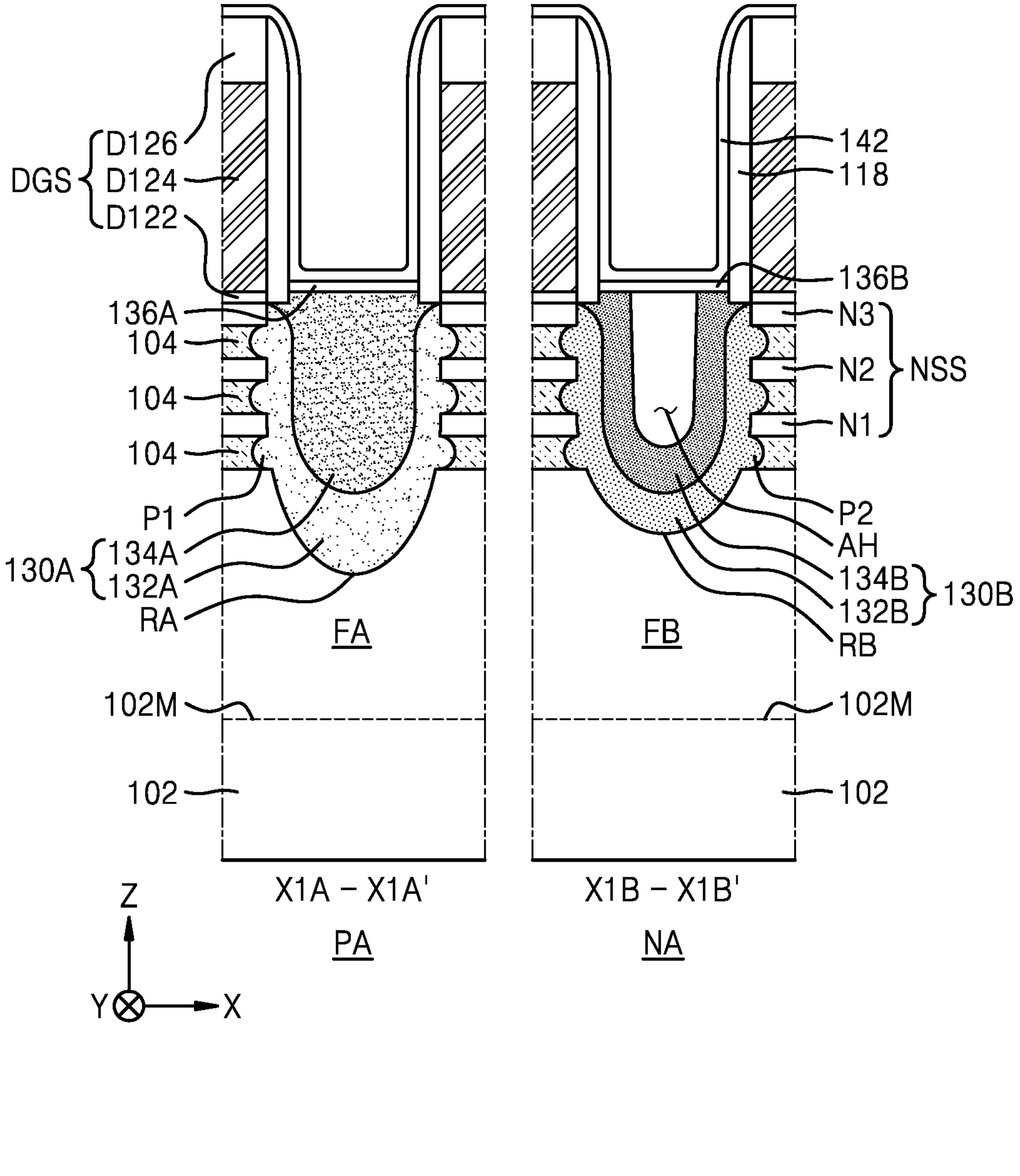

Referring to FIG. 11D, the insulating liner 142 may be formed in the first area PA and the second area NA to cover the resulting product of FIG. 11C. The insulating liner 142 may include a porous structure having a plurality of pores, and each of the plurality of pores may have a size enough for an Si atom and/or a Ge atom to pass through. In some embodiments, to form the insulating liner 142, an LPCVD process may be performed at a relatively low process temperature. For example, to form the insulating liner 142, a silicon nitride film may be formed by performing an LPCVD process at a temperature of about 630° C. or less, but the present disclosure is not limited thereto.

Next, the constituent material of the sacrificial film SCL may be decomposed by a chemical reaction, and the obtained decomposition products may be removed through the second semiconductor capping layer 136B and the insulating liner 142, thereby forming an air hole AH, which is defined by the second source/drain region 130B. As used herein, the term "air" may refer to the atmosphere or to other gases that may be present during a fabrication process.

In the process of decomposing the constituent material of the sacrificial film SCL by a chemical reaction, process conditions configured to selectively remove only the sacrificial film SCL out of the first source/drain region 130A and the sacrificial film SCL may be applied by using a difference between the Ge content in the first source/drain region 130A of the first area PA and the Ge content in the sacrificial film SCL of the second area NA. In some embodiments, to decompose the constituent material of the sacrificial film SCL by a chemical reaction, an ashing process using $H_2$ gas, $N_2$ gas, or a combination thereof may be used. In some embodiments, to decompose the constituent material of the sacrificial film SCL by a chemical reaction, a plasma treatment process using hydrogen radicals may be performed.

In some embodiments, unlike the description made with reference to FIG. 11D, before the insulating liner 142 is formed, the constituent material of the sacrificial film SCL in the resulting product of FIG. 11C may be decomposed by a chemical reaction according to the method described above. The obtained decomposition products may be removed through the second semiconductor capping layer 136B, thereby forming the air hole AH. In this case, after the air hole AH is formed, the insulating liner 142 may be formed on the second semiconductor capping layer 136B, similar to the description made with reference to FIG. 11D.

Figure 11E:
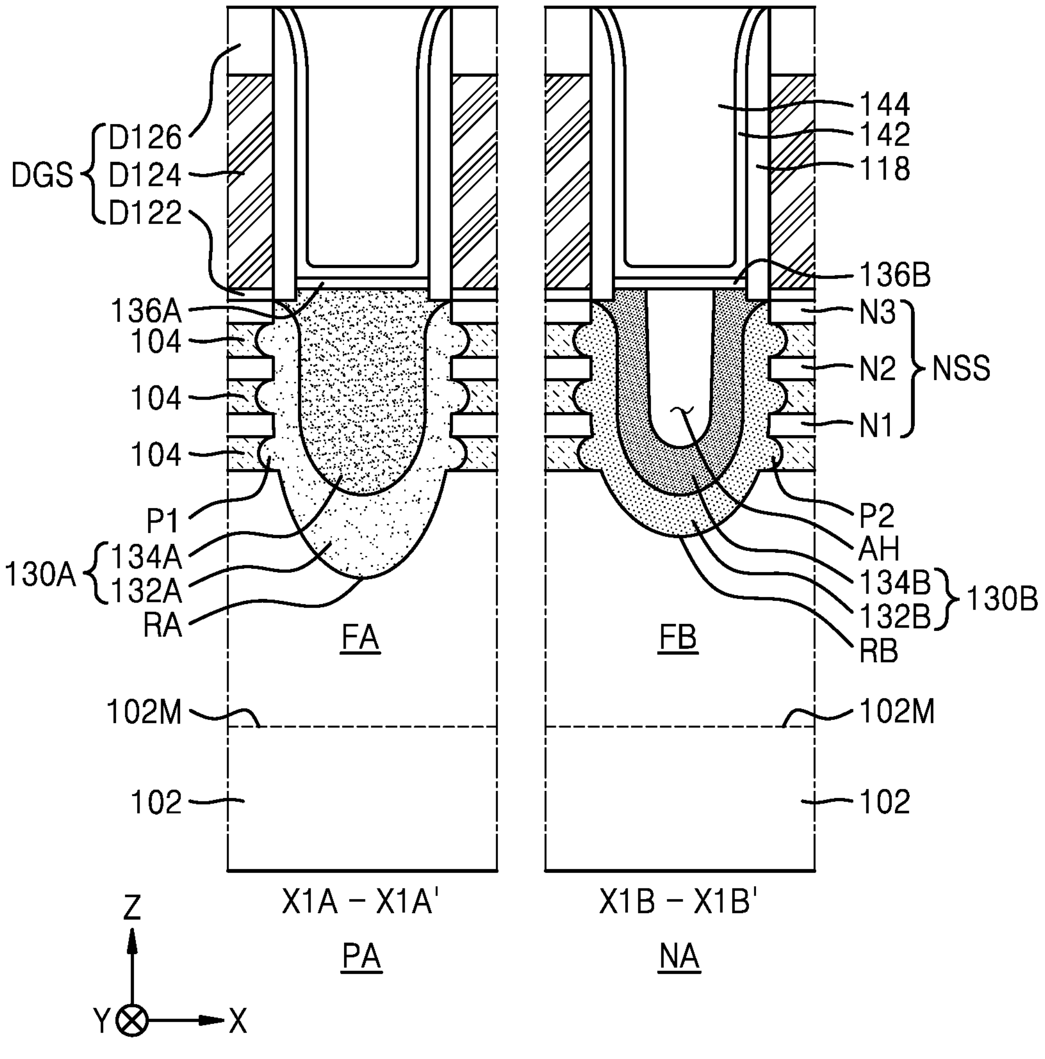

Referring to FIG. 11E, in the resulting product of FIG. 11D, the inter-gate dielectric 144 may be formed to cover the insulating liner 142, followed by planarizing the insulating liner 142 and the inter-gate dielectric 144, thereby exposing an upper surface of the capping layer D126.

Figure 11F:
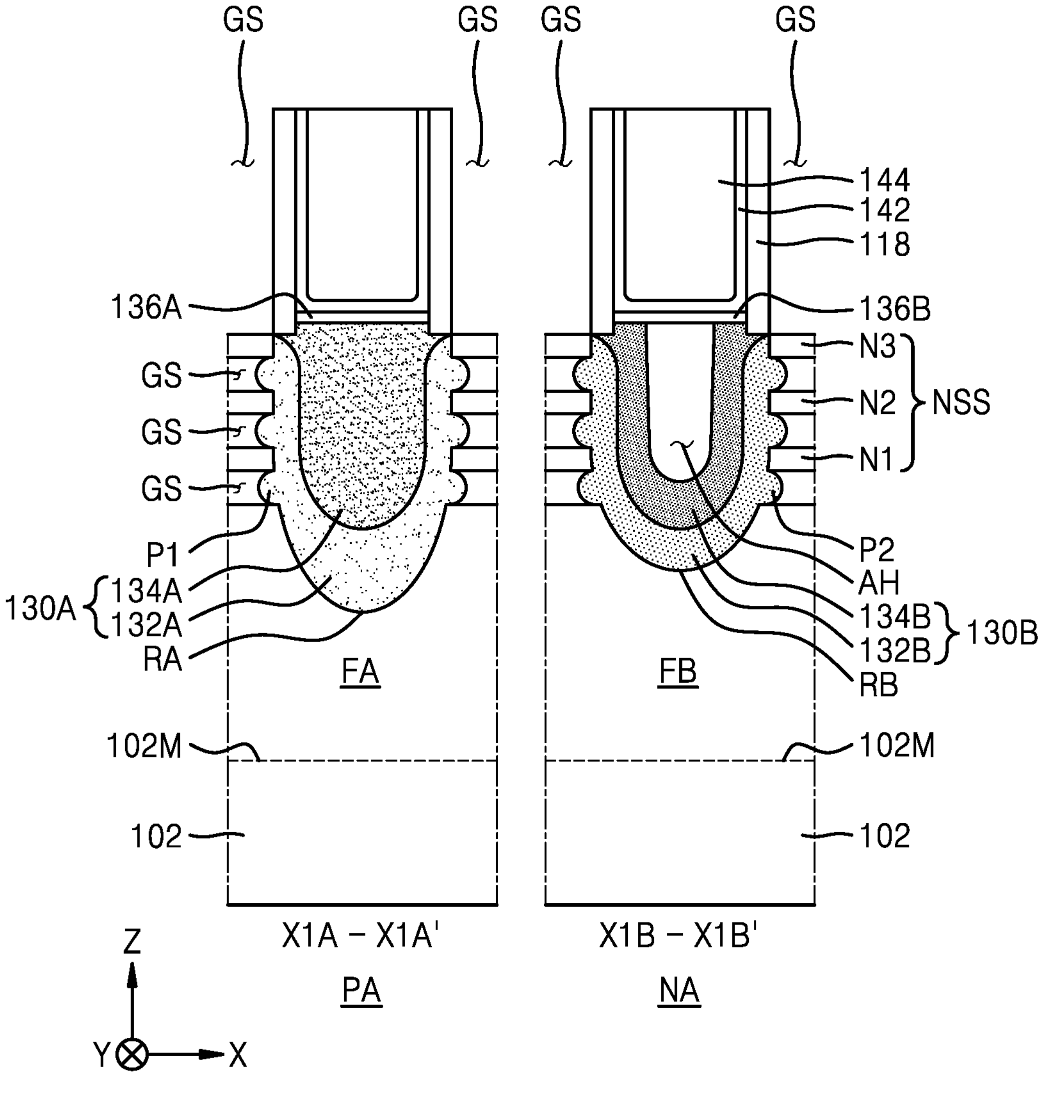

Referring to FIG. 11F, an upper surface of the dummy gate layer D124 may be exposed by removing the capping layer D126 from the resulting product of FIG. 11E, and the insulating liner 142 and the inter-gate dielectric 144 may be partially removed such that the upper surface of the inter-gate dielectric 144 and the upper surface of the dummy gate layer D124 may be at an approximately equal level.

Next, a gate space GS may be prepared by removing the dummy gate layer D124 and the oxide film D122 thereunder, and the plurality of nanosheet stacks NSS may each be exposed by the gate space GS. Next, by removing the plurality of sacrificial semiconductor layers 104 through the gate space GS, the gate space GS may expand up to each space between the first nanosheet N1, the second nanosheet $N_2$, and the third nanosheet N3 and a space between the first nanosheet N1 and each of the first and second fin-type active regions FA and FB.

In some embodiments, to selectively remove the plurality of sacrificial semiconductor layers 104, a difference in etch selectivity between each of the first to third nanosheets N1, $N_2$, and N3 and each of the plurality of sacrificial semiconductor layers 104 may be used. To selectively remove the plurality of sacrificial semiconductor layers 104, a liquid-phase or gas-phase etchant may be used. In some embodiments, to selectively remove the plurality of sacrificial semiconductor layers 104, a $CH_3COOH$-based etching solution, for example, an etching solution including a mixture of $CH_3COOH$, $HNO_3$, and HF, or an etching solution including a mixture of $CH_3COOH$, $H_2O_2$, and HF, may be used, but the present disclosure is not limited thereto.

Figure 11G:
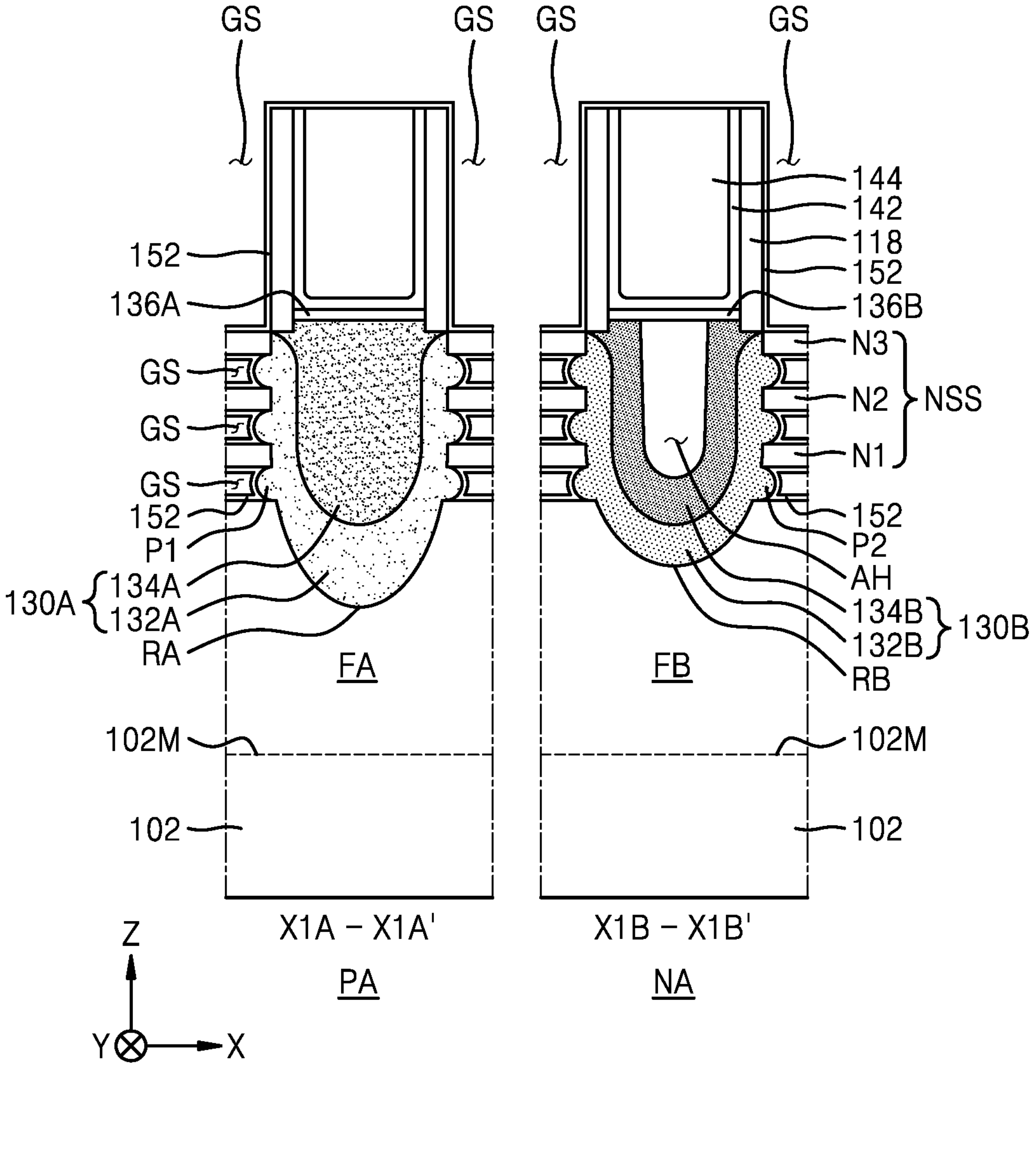

Referring to FIG. 11G, in the resulting product of FIG. 11F, the gate dielectric film 152 may be formed to cover respective exposed surfaces of the first to third nanosheets N1, $N_2$, and N3 and the first and second fin-type active regions FA and FB. To form the gate dielectric film 152, an atomic layer deposition (ALD) process may be used.

Figure 11H:
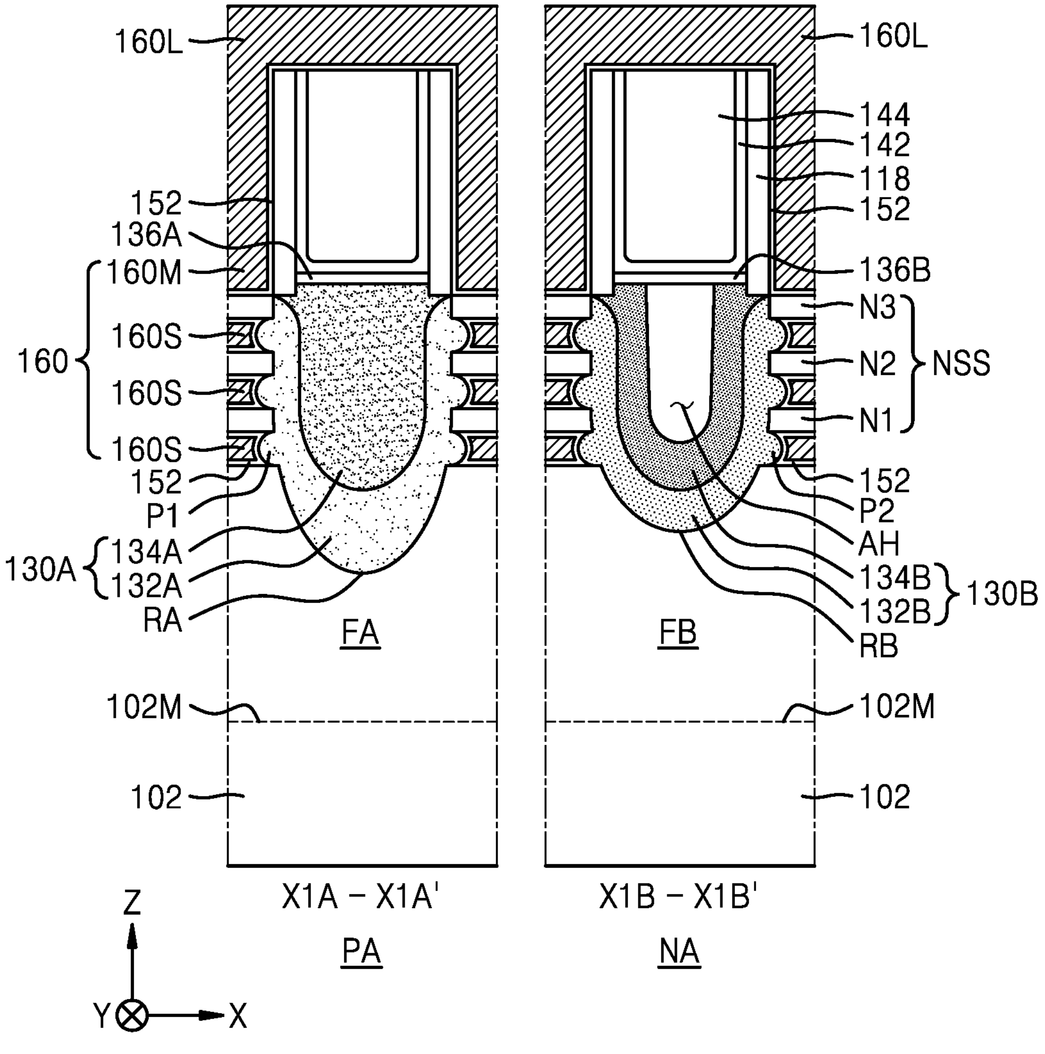

Referring to FIG. 11H, a gate formation conductive layer 160L may be formed on the gate dielectric film 152 to fill the gate space GS (see FIG. 11G) and cover the upper surface of the inter-gate dielectric 144. The gate formation conductive layer 160L may include a metal, a metal nitride, a metal carbide, or a combination thereof. To form the gate formation conductive layer 160L, an ALD process or a CVD process may be used.

Figure 11I:
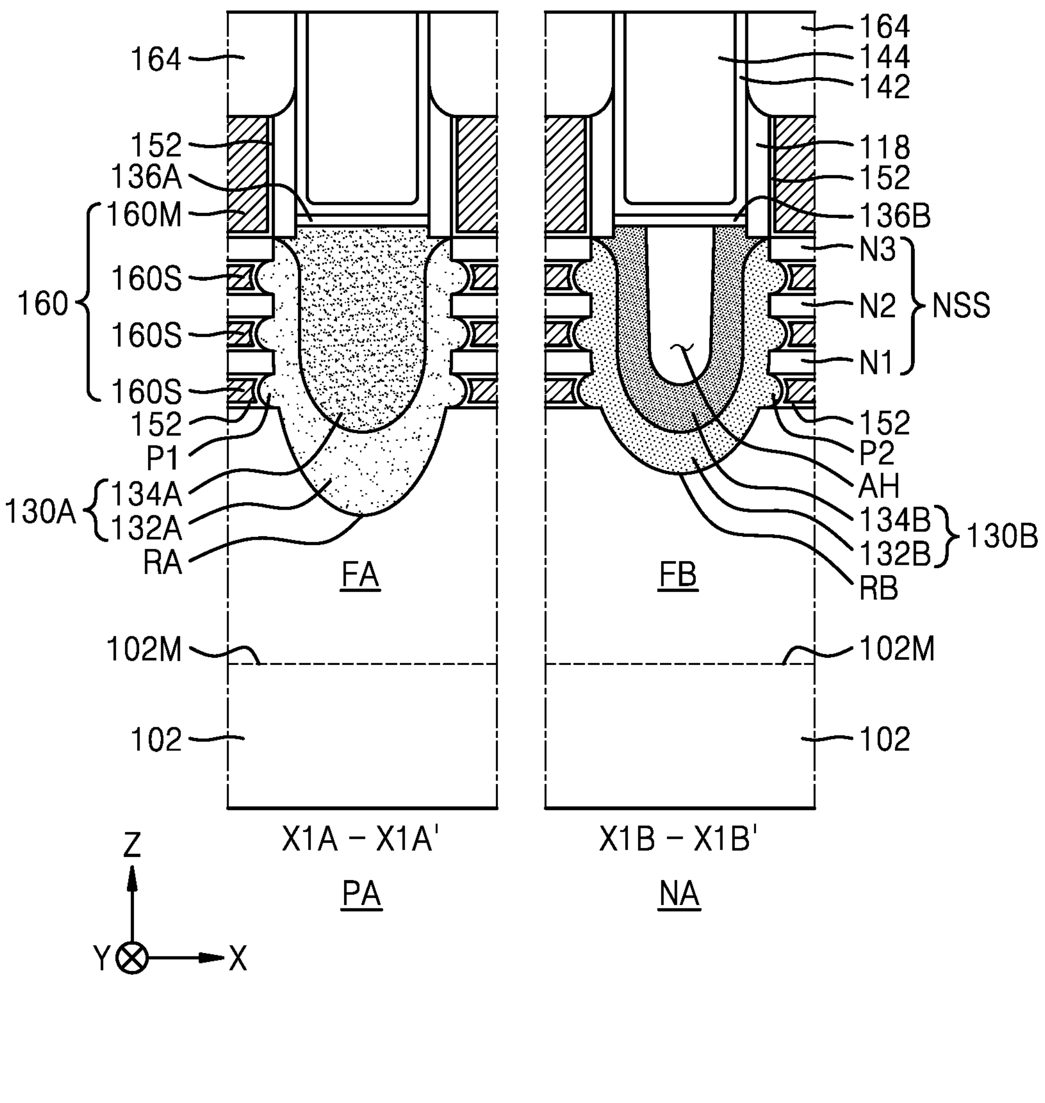

Referring to FIG. 11I, in the resulting product of FIG. 11H, each of the gate formation conductive layer 160L, the gate dielectric film 152, and the outer insulating spacer 118 may be partially removed from an upper surface thereof such that the upper surface of the inter-gate dielectric 144 is exposed and an upper portion of the gate space GS is emptied again, thereby forming the gate line 160. Next, the capping insulating pattern 164 may be formed on the gate line 160 to fill the gate space GS.

Figure 11J:
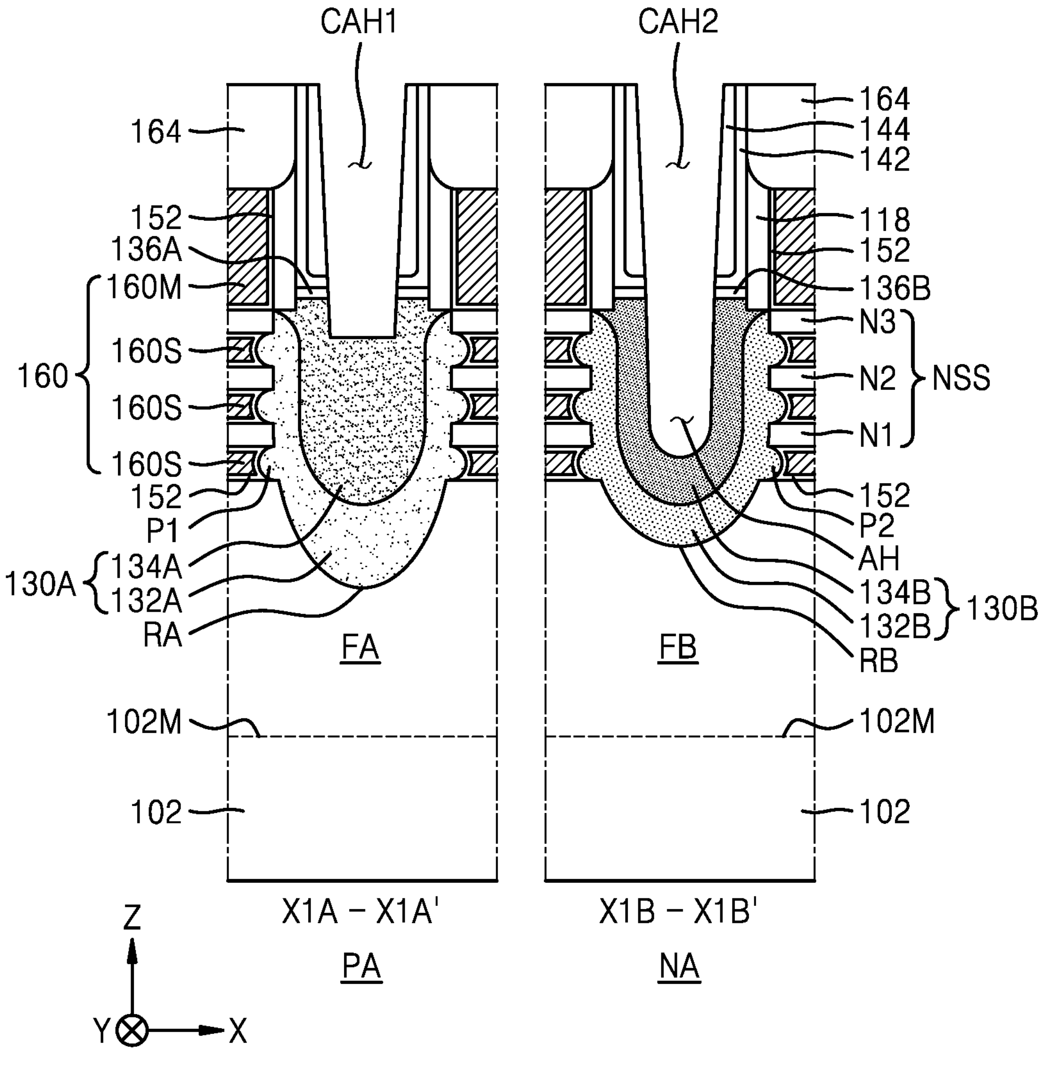

Referring to FIG. 11J, in the first area PA and the second area NA, each of the inter-gate dielectric 144, the insulating liner 142, the first semiconductor capping layer 136A, and the second semiconductor capping layer 136B may be partially removed, thereby forming a plurality of source/drain contact holes CAH1 and CAH2.

In the first area PA and the second area NA, the plurality of source/drain contact holes CAH1 and CAH2 may be simultaneously formed. In the first area PA, during the formation of a source/drain contact hole CAH1, the first source/drain region 130A may be partially removed from the upper surface thereof, and as a result, the source/drain contact hole CAH1 may pass through an upper portion of the first source/drain region 130A. In the second area NA, a source/drain contact hole CAH2 may be connected with the air hole AH.

Figure 11K:
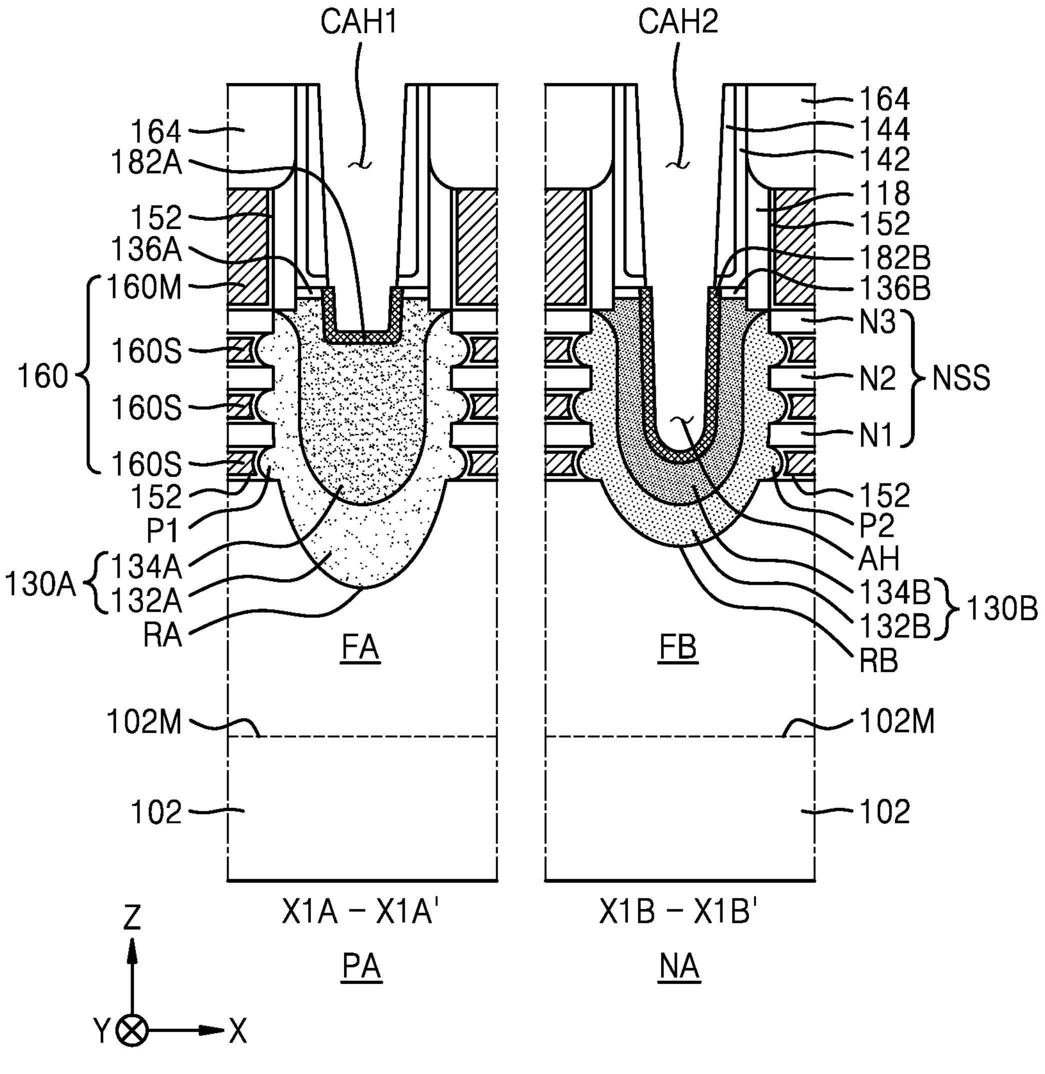

Referring to FIG. 11K, in the first area PA and the second area NA, the first and second metal silicide films 182A and 182B may be respectively formed on surfaces of the first source/drain region 130A and the second source/drain region 130B, which are respectively exposed by the plurality of source/drain contact holes CAH1 and CAH2.

Figure 11L:
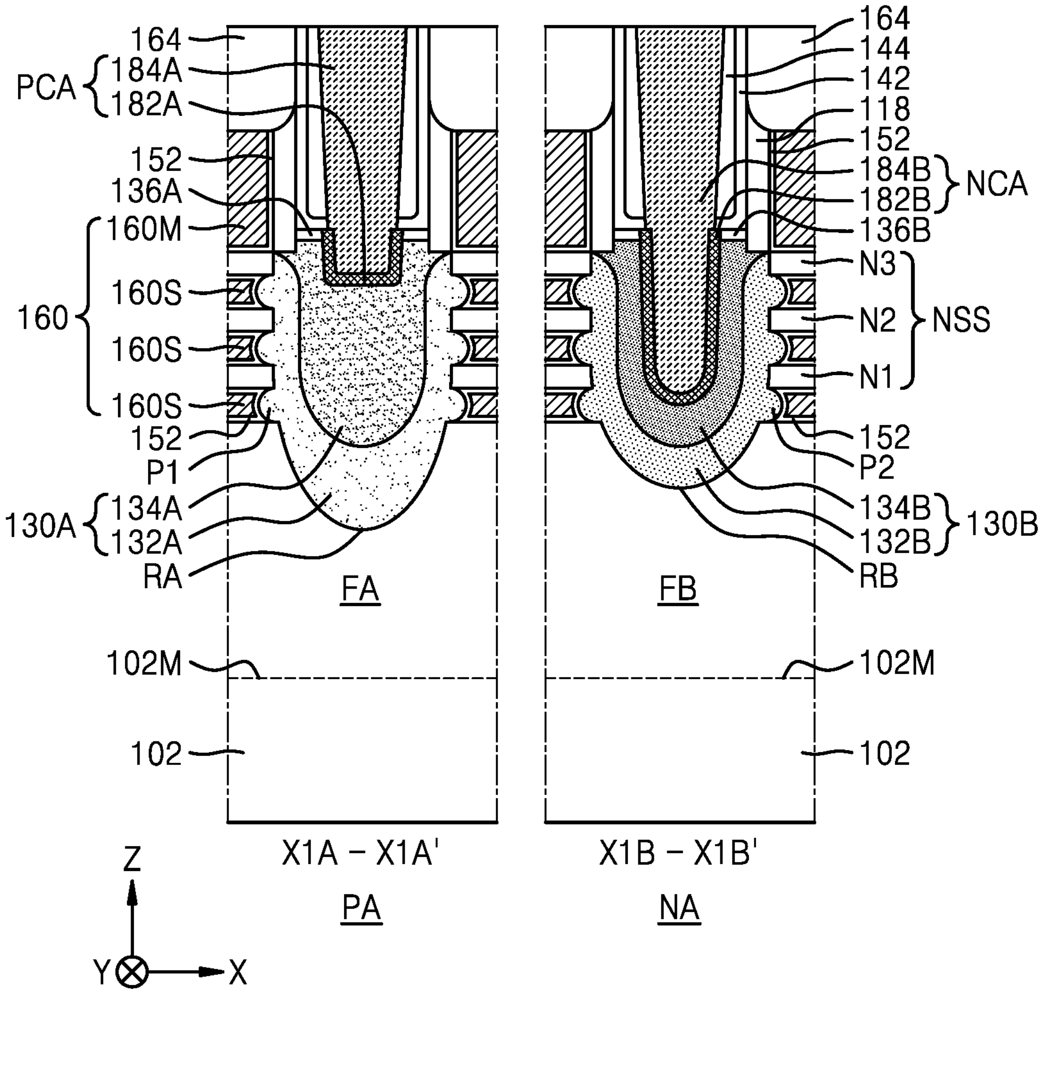

Referring to FIG. 11L, in the resulting product of FIG. 11K, the first and second conductive plugs 184A and 184B may be formed to respectively fill spaces over the first and second metal silicide films 182A and 182B, thereby forming the first and second contact structures PCA and NCA.

Figure 12A:
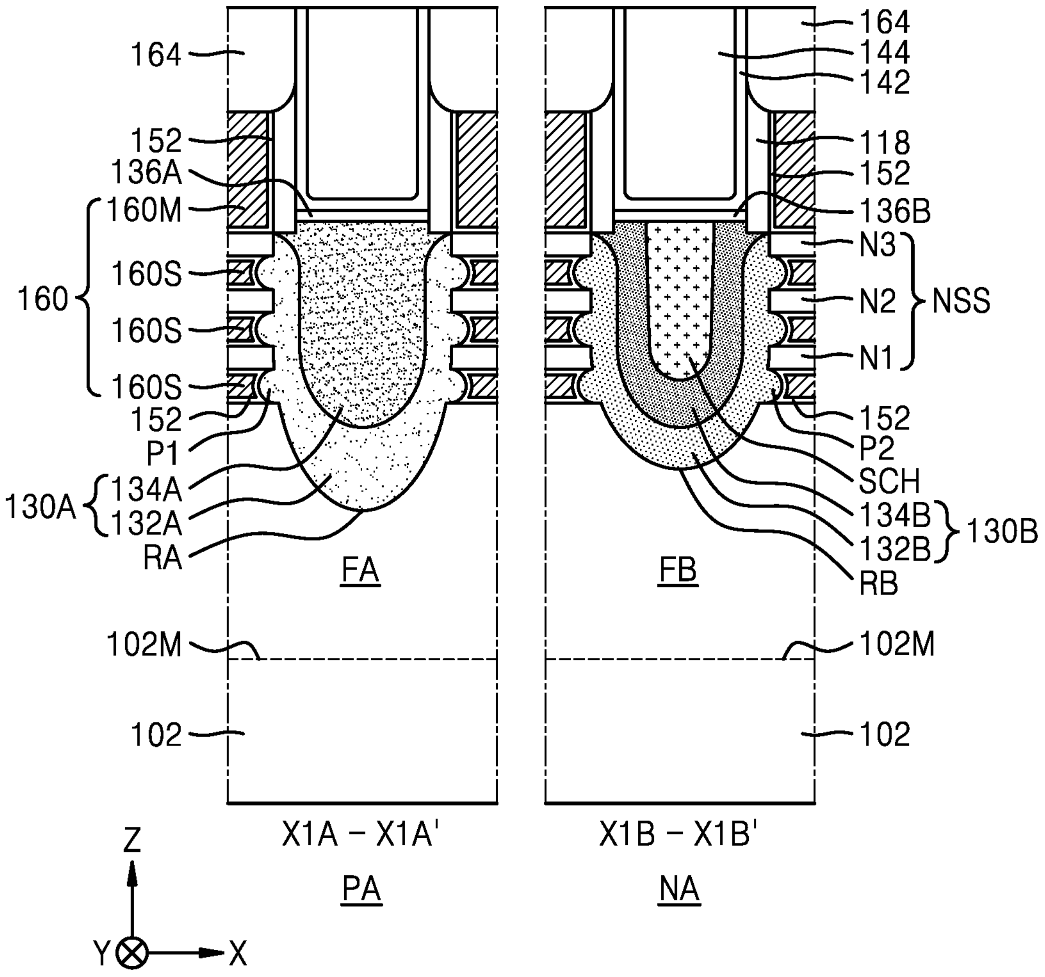
FIGS. 12A and 12B are cross-sectional views illustrating corresponding processes thereto from among a sequence of processes of a method of fabricating an integrated circuit device according to some embodiments of the present disclosure.
Figure 12B:
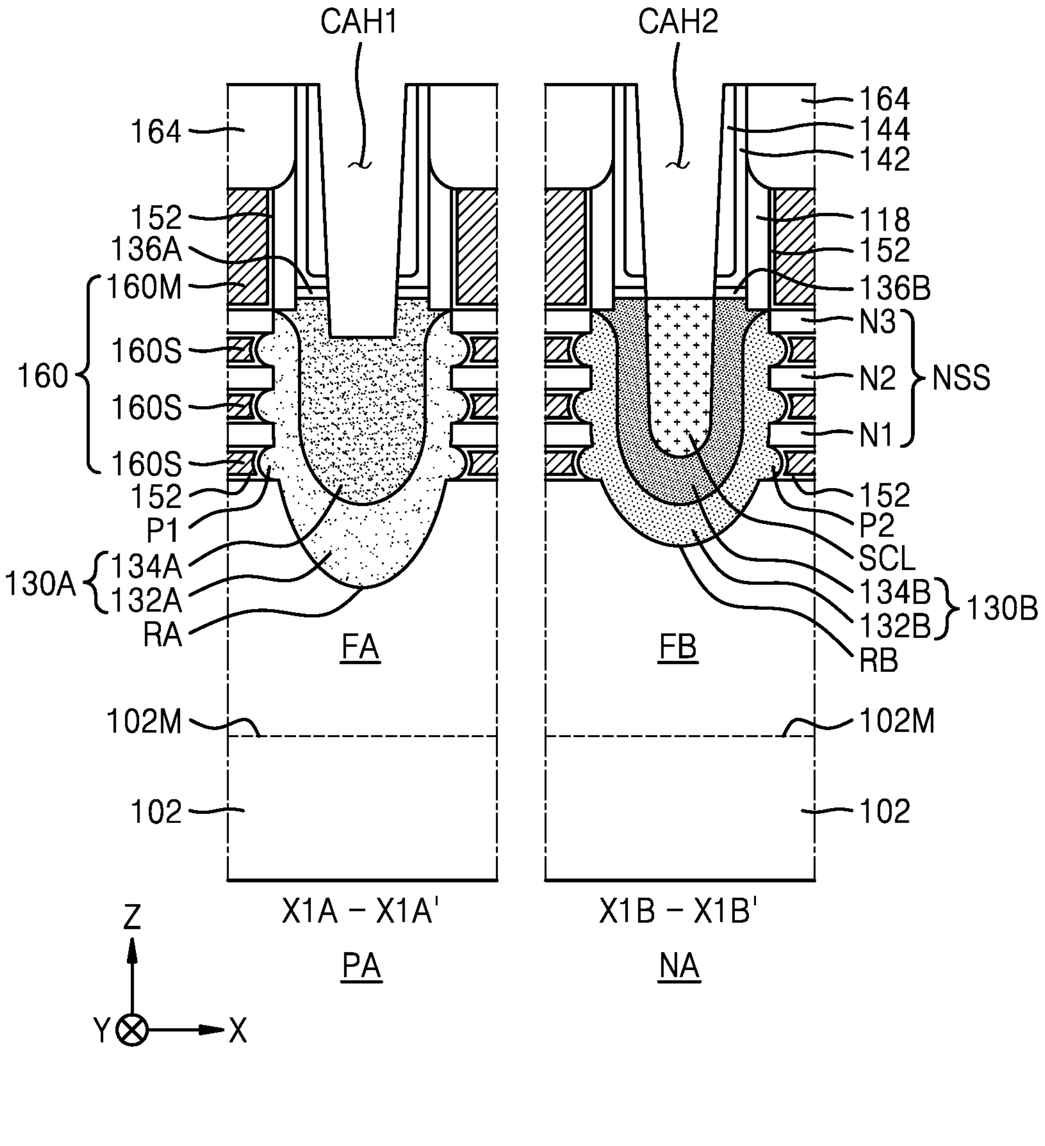

FIGS. 12A and 12B are cross-sectional views respectively illustrating corresponding processes thereto from among a sequence of processes of a method of fabricating an integrated circuit device, according to some embodiments. FIGS. 12A and 12B each illustrate cross-sectional configurations of regions respectively corresponding to the cross-sections taken along the lines X1A-X1A' and X1B and X1B' of FIG. 1, according to the sequence of processes. Another example of a method of fabricating the integrated circuit device 100 described with reference to FIGS. 1 and 2A to 2C is described with reference to FIGS. 12A and 12B. In FIGS. 12A and 12B, the same reference numerals as in FIGS. 1, 2A to 2C, and 11A to 11L respectively denote the same members, and here, repeated descriptions thereof are omitted.

Referring to FIG. 12A, the processes described with reference to FIGS. 11A to 11I may be performed. However, without removing the sacrificial film SCL in the process described with reference to FIG. 11D, the processes described with reference to FIGS. 11E to 11I may be performed, thereby forming the structure shown in FIG. 12A.

Referring to FIG. 12B, in the resulting product of FIG. 12A, in a similar manner to that described with reference to FIG. 11J, each of the inter-gate dielectric 144, the insulating liner 142, the first semiconductor capping layer 136A, and the second semiconductor capping layer 136B of the first area PA and the second area NA may be partially removed, thereby forming the plurality of source/drain contact holes CAH1 and CAH2. As a result, in the second area NA, the sacrificial film SCL may be exposed by the source/drain contact hole CAH2.

Next, the sacrificial film SCL may be removed from the resulting product of FIG. 12B through the source/drain contact hole CAH2. To remove the sacrificial film SCL, the same process as described with reference to FIG. 11D may be performed.

After the sacrificial film SCL is removed from the resulting product of FIG. 12B, the same processes as described with reference to FIGS. 11K and 11L may be performed, thereby fabricating the integrated circuit device 100 shown in FIGS. 1 and 2A to 2C.

Figure 13:
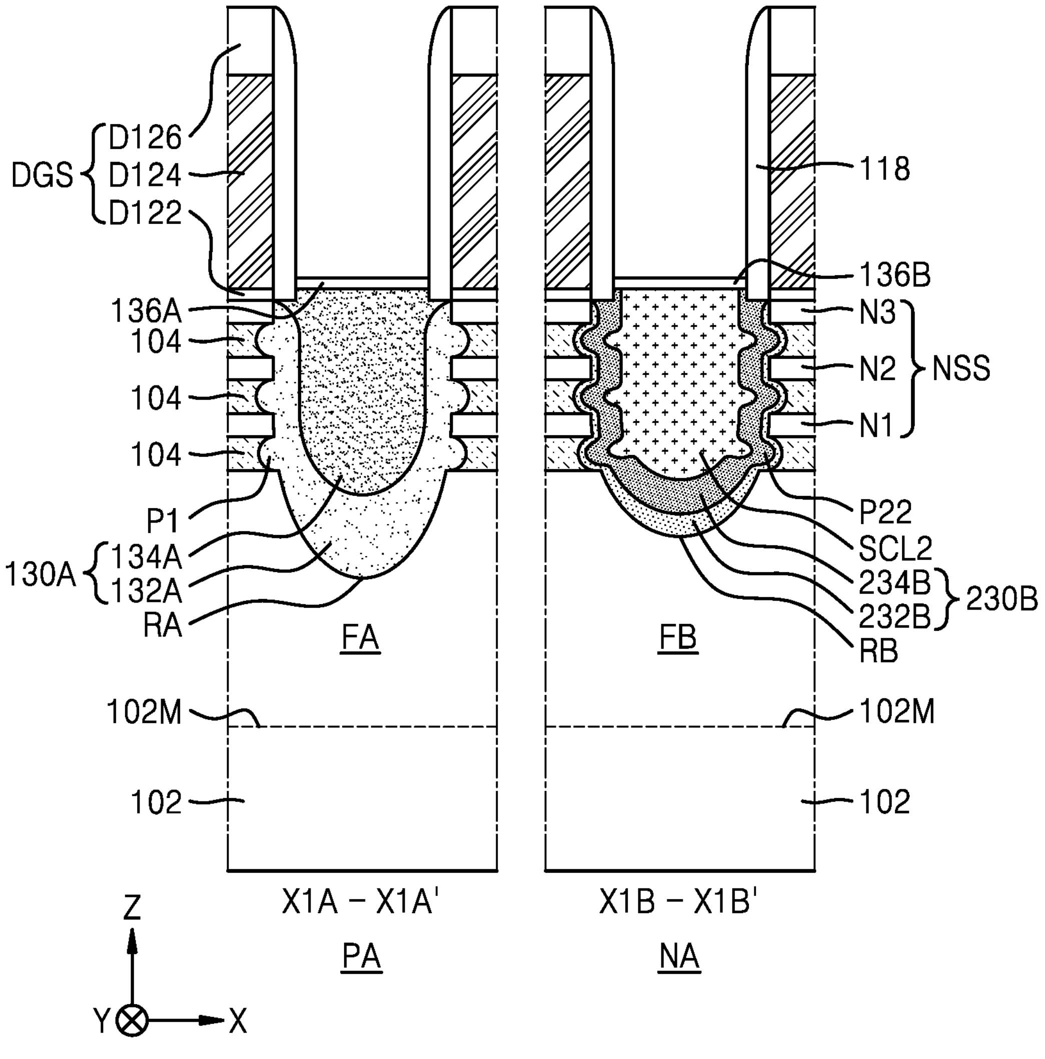
FIG. 13 is a cross-sectional view illustrating a corresponding process thereto from among a sequence of processes of a method of fabricating an integrated circuit device according to some embodiments of the present disclosure.

FIG. 13 is a cross-sectional view illustrating a corresponding process thereto from among a sequence of processes of a method of fabricating an integrated circuit device, according to some embodiments. FIG. 13 illustrates cross-sectional configurations of regions respectively corresponding to the cross-sections taken along the lines X1A-X1A' and X1B and X1B' of FIG. 1, according to the sequence of processes. An example of a method of fabricating the integrated circuit device 200 is described with reference to FIG. 13. In FIG. 13, the same reference numerals as in FIGS. 1, 2A to 2C, 5A and 5B, and 11A to 11L respectively denote the same members, and here, repeated descriptions thereof are omitted.

Referring to FIG. 13, the processes described with reference to FIGS. 11A to 11C may be performed. However, in the process described with reference to FIG. 11C, instead of the second source/drain region 130B, the second source/drain region 230B may be formed in the second area NA. After the second source/drain region 230B is formed, an exposed surface of the second upper body layer 234B of the second source/drain region 230B may include a nonlinear-shaped portion including a plurality of concave-convex portions to correspond to a profile of the plurality of protrusions P2 of the second source/drain region 230B.

Next, a sacrificial film SCL2 may be formed to fill a sacrificial space over the second source/drain region 230B. An outer sidewall of the sacrificial film SCL2 may include a nonlinear-shaped portion including a plurality of concave-convex portions in correspondence with the nonlinear-shaped portion of the second upper body layer 234B of the second source/drain region 230B. A more detailed configuration of the sacrificial film SCL2 is substantially the same as that of the sacrificial film SCL, which is described with reference to FIG. 11C.

Next, the same processes as described with reference to FIGS. 11D to 11L may be performed on the resulting product of FIG. 13, thereby fabricating the integrated circuit device 200 shown in FIGS. 5A and 5B.

Heretofore, although the examples of the method of fabricating the integrated circuit devices 100 shown in FIGS. 1 and 2A to 2C and the integrated circuit devices 200 shown in FIGS. 5A and 5B have been described with reference to FIGS. 11A to 13, it will be understood by those of ordinary skill in the art that, by making various modifications and changes to the examples described with reference to FIGS. 11A to 13 without departing from the spirit and scope of the present disclosure, the integrated circuit devices shown in FIGS. 3, 4, and 6 to 9B and integrated circuit devices having various structures modified and changed therefrom may be fabricated.

While the present disclosure has been particularly shown and described with reference to embodiments thereof, it will be understood that various changes in form and details may be made therein without departing from the spirit and scope of the following claims.

What is claimed is:

1. An integrated circuit device comprising:

a first transistor comprising a first conductivity type, the first transistor comprising a first fin-type active region on a first area of a substrate, a first channel region on the first fin-type active region, and a first source/drain region that is on the first fin-type active region and contacts the first channel region;

a second transistor comprising a second conductivity type, the second transistor comprising a second fin-type active region on a second area of the substrate, a second channel region on the second fin-type active region, and a second source/drain region on the second fin-type active region and that contacts the second channel region;

a first contact structure that contacts the first source/drain region and comprises a first length in a vertical direction, wherein the first contact structure extends from above the first source/drain region and beyond an uppermost surface of the first channel region by a first vertical distance;

a second contact structure that contacts the second source/drain region and comprises a second length in the vertical direction, wherein the second contact structure extends from above the second source/drain region and beyond an uppermost surface of the second channel region by a second vertical distance; and a semiconductor capping layer that contacts an upper surface of the second source/drain region, wherein a density of the semiconductor capping layer is less than a density of the second source/drain region, wherein the second vertical distance is greater than the first vertical distance, and wherein the second length of the second contact structure is greater than the first length of the first contact structure.

2. The integrated circuit device of claim 1, wherein a difference between the first length of the first contact structure and the second length of the second contact structure is at least 10 nm.

3. The integrated circuit device of claim 1, wherein the first contact structure comprises a first contact portion that contacts the first source/drain region, the second contact structure comprises a second contact portion that contacts the second source/drain region, and, in the vertical direction a length of the second contact portion is greater than a length of the first contact portion by at least 10 nm.

4. The integrated circuit device of claim 1, wherein the second channel region comprises a plurality of nanosheets spaced apart from the second fin-type active region in the vertical direction and spaced apart from each other in the vertical direction, the second transistor further comprises a gate line that at least partially surrounds the plurality of nanosheets, and the second source/drain region comprises a plurality of protrusions that are convex toward the gate line.

5. The integrated circuit device of claim 1, wherein the first contact structure comprises a first conductive plug that is spaced apart from the first source/drain region and a first metal silicide film that contacts the first source/drain region and is between the first conductive plug and the first source/drain region, the second contact structure comprises a second conductive plug that is spaced apart from the second source/drain region and a second metal silicide film that contacts the second source/drain region and is between the second conductive plug and the second source/drain region, and a length of the second metal silicide film in the vertical direction is greater than a length of the first metal silicide film in the vertical direction.

6. The integrated circuit device of claim 1, wherein the semiconductor capping layer at least partially surrounds a sidewall of a conductive plug of the second contact structure.

7. The integrated circuit device of claim 1, wherein each of the first channel region and the second channel region comprises a plurality of nanosheets that are spaced apart from each other in the vertical direction, the first contact structure faces, in a horizontal direction, m nanosheets selected from the plurality of nanosheets of the first channel region, wherein m is a natural number that is greater than or equal to 1, and the second contact structure faces, in the horizontal direction, n nanosheets selected from the plurality of nanosheets of the second channel region, wherein n is a natural number that is greater than m.

8. The integrated circuit device of claim 1, wherein the second channel region comprises a plurality of nanosheets spaced apart from the second fin-type active region in the vertical direction and spaced apart from each other in the vertical direction, and a sidewall of the second contact structure faces the second channel region and contacts the second source/drain region, wherein the sidewall of the second contact structure comprises a non-linear shaped portion that comprises a plurality of local protrusions extending outward in a horizontal direction.

9. The integrated circuit device of claim 1, wherein the second channel region comprises a plurality of nanosheets spaced apart from the second fin-type active region in the vertical direction and spaced apart from each other in the vertical direction, the second transistor further comprises a gate line that at least partially surrounds the plurality of nanosheets, and the second contact structure comprises a non-linear shaped portion that is buried in the second source/drain region, wherein the non-linear shaped portion comprises a plurality of local protrusions that are convex toward the gate line.

10. The integrated circuit device of claim 1, wherein the first channel region and the first fin-type active region are monolithic, the second channel region and the second fin-type active region are monolithic, the first contact structure comprises a first conductive plug that is spaced apart from the first source/drain region and a first metal silicide film that contacts the first source/drain region and is between the first conductive plug and the first source/drain region, the second contact structure comprises a second conductive plug that is spaced apart from the second source/drain region and a second metal silicide film that contacts the second source/drain region and is between the second conductive plug and the second source/drain region, and a length of the second metal silicide film in the vertical direction is greater than a length of the first metal silicide film in the vertical direction.

11. An integrated circuit device comprising:

a first fin-type active region on a first area of a substrate;

a first channel region on the first fin-type active region;

a first source/drain region that is on the first fin-type active region and contacts the first channel region;

a first gate line on the first channel region;

a first insulating structure on the first source/drain region;

a first contact structure that extends through the first insulating structure and contacts the first source/drain region, wherein the first contact structure comprises a first length in a vertical direction;

a second fin-type active region on a second area of the substrate;

a second channel region on the second fin-type active region;

a second source/drain region that is on the second fin-type active region and contacts the second channel region;

a second gate line on the second channel region;

a second insulating structure on the second source/drain region; and a second contact structure that extends through the second insulating structure and contacts the second source/drain region, the second contact structure comprising a second length in the vertical direction, wherein the second length is greater than the first length of the first contact structure, wherein the first contact structure extends toward the substrate and beyond an uppermost surface of the first channel region by a first vertical distance, the second contact structure extends toward the substrate and beyond an uppermost surface of the second channel region by a second vertical distance, wherein the second vertical distance is greater than the first vertical distance, and the second contact structure comprises a nonlinear-shaped portion that faces the second channel region in a horizontal direction, and the nonlinear-shaped portion comprising a plurality of local protrusions that extend toward the second gate line.

12. The integrated circuit device of claim 11, wherein the second vertical distance is greater than the first vertical distance by at least 10 nm.

13. The integrated circuit device of claim 11, wherein each of the first channel region and the second channel region comprises a plurality of nanosheets that are spaced apart from each other in the vertical direction, and at least some of the plurality of nanosheets of the first channel region do not face the first contact structure in the horizontal direction, and the nonlinear-shaped portion faces at least two nanosheets selected from the plurality of nanosheets of the second channel region in the horizontal direction.

14. The integrated circuit device of claim 11, further comprising a plurality of inner insulating spacers between the second source/drain region and the second gate line, wherein the plurality of inner insulating spacers contact the second source/drain region, wherein each of the first channel region and the second channel region comprises a plurality of nanosheets that are spaced apart from each other in the vertical direction, and the plurality of inner insulating spacers are respectively between the plurality of nanosheets of the second channel region, and wherein the plurality of local protrusions extend toward the plurality of inner insulating spacers.

15. The integrated circuit device of claim 11, wherein the second insulating structure comprises an insulating liner on the second source/drain region, and an inter-gate dielectric spaced apart from the second source/drain region and on a sidewall of the second gate line, wherein the insulating liner is between the second source/drain region and the inter-gate dielectric, and a density of the insulating liner is less than a density of the inter-gate dielectric.

16. The integrated circuit device of claim 11, wherein the second channel region comprises a plurality of nanosheets spaced apart from the second fin-type active region in the vertical direction and spaced apart from each other in the vertical direction, the second contact structure comprises a conductive plug spaced apart from the second source/drain region and a metal silicide film that contacts the second source/drain region and is between the conductive plug and the second source/drain region, each of the metal silicide film and the conductive plug comprises the plurality of local protrusions that are respectively arranged between the plurality of nanosheets and extend toward the second gate line, and in a horizontal direction, a minimum distance between the second contact structure and the plurality of nanosheets is greater than a minimum distance between the second contact structure and the second gate line.

17. An integrated circuit device comprising:

a first fin-type active region on a substrate;

a first channel region on the first fin-type active region;

a first gate line on the first channel region;

a first source/drain region on the first fin-type active region and that contacts the first channel region;

a first contact structure that contacts the first source/drain region and comprises a first length in a vertical direction, wherein the first contact structure extends from above the first source/drain region and beyond an uppermost surface of the first channel region by a first vertical distance;

a second fin-type active region on the substrate;

a second channel region on the second fin-type active region and comprising a plurality of nanosheets spaced apart from each other in the vertical direction;

a second gate line on the plurality of nanosheets;

a second source/drain region that is on the second fin-type active region and contacts the plurality of nanosheets, the second source/drain region comprising a plurality of protrusions that are convex toward the second gate line; and a second contact structure that contacts the second source/drain region and comprising a second length in the vertical direction, wherein the second contact structure extends from above the second source/drain region and beyond an uppermost surface of the second channel region by a second vertical distance, wherein the second length is greater than the first length, wherein the second vertical distance is greater than the first vertical distance, and wherein the second contact structure comprises a non-linear shaped portion that faces the second channel region and comprises a plurality of local protrusions that extend outwardly in a horizontal direction.

18. The integrated circuit device of claim 17, wherein a difference between the first length of the first contact structure and the second length of the second contact structure is at least 10 nm.

19. The integrated circuit device of claim 17, wherein the first contact structure comprises a first conductive plug that is spaced apart from the first source/drain region and a first metal silicide film that contacts the first source/drain region and is between the first conductive plug and the first source/drain region, the second contact structure comprises a second conductive plug that is spaced apart from the second source/drain region and a second metal silicide film that contacts the second source/drain region and is between the second conductive plug and the second source/drain region, and a length of the second metal silicide film in the vertical direction is greater than a length of the first metal silicide film in the vertical direction.

20. The integrated circuit device of claim 17, further comprising:

an insulating liner that is on the second source/drain region and at least partially surrounds a portion of a sidewall of the second contact structure; and an inter-gate dielectric spaced apart from the second source/drain region, wherein the insulating liner is between the inter-gate dielectric and the second source/drain region, wherein the insulating liner at least partially surrounds another portion of the sidewall of the second contact structure, and wherein the inter-gate dielectric is on a sidewall of the second gate line, wherein a density of the insulating liner is less than a density of the inter-gate dielectric.

* * * * *